United States Patent
Ochi et al.

(10) Patent No.: US 12,096,650 B2
(45) Date of Patent: Sep. 17, 2024

(54) DISPLAY DEVICE

(71) Applicant: SHARP KABUSHIKI KAISHA, Sakai (JP)

(72) Inventors: Takashi Ochi, Sakai (JP); Jumpei Takahashi, Sakai (JP); Takeshi Hirase, Sakai (JP); Tohru Sonoda, Sakai (JP); Tsuyoshi Senzaki, Yonago (JP); Takeshi Yaneda, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 387 days.

(21) Appl. No.: 17/442,566

(22) PCT Filed: Mar. 29, 2019

(86) PCT No.: PCT/JP2019/013980
§ 371 (c)(1),
(2) Date: Sep. 23, 2021

(87) PCT Pub. No.: WO2020/202247
PCT Pub. Date: Oct. 8, 2020

(65) Prior Publication Data
US 2022/0190290 A1    Jun. 16, 2022

(51) Int. Cl.
*H10K 50/844* (2023.01)
*H10K 59/12* (2023.01)
(Continued)

(52) U.S. Cl.
CPC ......... *H10K 50/844* (2023.02); *H10K 59/121* (2023.02); *H10K 59/65* (2023.02);
(Continued)

(58) Field of Classification Search
CPC .. H10K 59/122; H10K 59/12; H10K 59/1201; H10K 50/844; H10K 50/8426;
(Continued)

(56) References Cited

U.S. PATENT DOCUMENTS 8,111,220 B2 * 2/2012 Asano ................ H10K 50/8426
345/204
9,632,487 B2 * 4/2017 Kim .................... H10K 59/1213
(Continued)

FOREIGN PATENT DOCUMENTS

JP        2014086415 A      5/2014

*Primary Examiner* — Sophia T Nguyen
(74) *Attorney, Agent, or Firm* — ScienBiziP, P.C.

(57) ABSTRACT

A display device includes a base substrate, a thin film transistor layer including an upper layer insulating film and an organic resin layer, a plurality of light-emitting elements provided on the thin film transistor layer and each including a common function layer, a non-display region provided in the display region, an opening provided in the non-display region and passing through the base substrate, and a first frame-shaped protruding portion provided on the upper layer insulating film in a circumferential shape along the opening. The first frame-shaped protruding portion includes a portion where an area of a transverse section parallel to an upper face of the base substrate decreases from an upper face to a bottom face, the common function layer is also provided in the non-display region, and a slit surrounding the first frame-shaped protruding portion is formed in the common function layer provided in the non-display region.

17 Claims, 14 Drawing Sheets

(51) Int. Cl.
  *H10K 59/121* (2023.01)
  *H10K 59/65* (2023.01)
  *H10K 71/00* (2023.01)
  *H10K 77/10* (2023.01)
  *H10K 102/00* (2023.01)

(52) U.S. Cl.
  CPC ............ *H10K 71/00* (2023.02); *H10K 77/111* (2023.02); *H10K 59/1201* (2023.02); *H10K 2102/311* (2023.02)

(58) Field of Classification Search
  CPC .. H10K 50/841; H10K 50/84; H10K 50/8445; H10K 50/858
  See application file for complete search history.

(56) References Cited

U.S. PATENT DOCUMENTS

| | | | | |
|---|---|---|---|---|
| 10,050,095 B2* | 8/2018 | Kim | | H10K 59/131 |
| 10,135,028 B2* | 11/2018 | Kim | | H10K 59/12 |
| 10,224,508 B2* | 3/2019 | Cai | | H10K 59/1213 |
| 10,873,053 B2* | 12/2020 | Sung | | H10K 59/40 |
| 10,897,026 B2* | 1/2021 | Abe | | H05B 33/22 |
| 10,916,608 B2* | 2/2021 | Kim | | H10K 59/122 |
| 11,302,892 B2* | 4/2022 | Xie | | H10K 71/00 |
| 11,302,894 B2* | 4/2022 | Wang | | H10K 59/123 |
| 11,380,871 B2* | 7/2022 | Yang | | H05B 33/04 |
| 11,444,262 B2* | 9/2022 | Wang | | H10K 50/844 |
| 11,469,392 B2* | 10/2022 | Zhang | | H01L 29/458 |
| 11,581,511 B2* | 2/2023 | Chen | | H10K 59/12 |
| 11,711,950 B2* | 7/2023 | Park | | H10K 59/871 257/72 |
| 2003/0164674 A1* | 9/2003 | Imamura | | H10K 50/8445 313/493 |
| 2007/0188093 A1* | 8/2007 | Nagara | | H10K 59/173 313/504 |
| 2012/0205700 A1* | 8/2012 | Tanada | | H10K 50/814 438/46 |
| 2014/0117330 A1 | 5/2014 | Cho et al. | | |
| 2014/0353609 A1* | 12/2014 | Song | | H10K 50/82 438/23 |
| 2015/0091030 A1* | 4/2015 | Lee | | H10K 50/844 438/34 |
| 2016/0126494 A1* | 5/2016 | Jung | | H10K 50/86 438/23 |
| 2016/0293884 A1* | 10/2016 | Zhang | | H10K 71/00 |
| 2017/0117502 A1* | 4/2017 | Park | | H10K 59/124 |
| 2017/0141352 A1* | 5/2017 | Shin | | G02F 1/133345 |
| 2017/0148856 A1* | 5/2017 | Choi | | H10K 59/124 |
| 2017/0162111 A1* | 6/2017 | Kang | | H10K 50/844 |
| 2017/0162637 A1* | 6/2017 | Choi | | G09G 3/3225 |
| 2017/0221976 A1* | 8/2017 | Park | | H10K 50/844 |
| 2017/0237038 A1* | 8/2017 | Kim | | H10K 77/10 257/40 |
| 2017/0278912 A1* | 9/2017 | Kim | | H10K 59/122 |
| 2017/0288004 A1* | 10/2017 | Kim | | H10K 77/10 |
| 2018/0102502 A1* | 4/2018 | Kim | | H01L 22/12 |
| 2018/0239127 A1* | 8/2018 | Nishiki | | H01L 29/78633 |
| 2019/0051859 A1* | 2/2019 | Choi | | H10K 59/1213 |
| 2019/0067627 A1* | 2/2019 | Jia | | H10K 50/844 |
| 2019/0081117 A1* | 3/2019 | Moon | | H10K 50/844 |
| 2019/0173053 A1* | 6/2019 | Choi | | G06F 3/0412 |
| 2019/0214587 A1* | 7/2019 | Kim | | H10K 50/11 |
| 2019/0214600 A1* | 7/2019 | Park | | H10K 50/8445 |
| 2019/0245015 A1* | 8/2019 | Lee | | H10K 59/122 |
| 2019/0245159 A1* | 8/2019 | Kim | | H10K 59/122 |
| 2019/0288231 A1* | 9/2019 | He | | H10K 59/122 |
| 2019/0296261 A1* | 9/2019 | Lee | | H10K 71/00 |
| 2019/0334120 A1* | 10/2019 | Seo | | G06F 3/0444 |
| 2019/0341439 A1* | 11/2019 | Choi | | H10K 59/122 |
| 2020/0127231 A1* | 4/2020 | Yun | | H10K 59/124 |
| 2020/0127233 A1* | 4/2020 | Sung | | H10K 77/111 |
| 2020/0136087 A1* | 4/2020 | Kim | | H10K 59/122 |
| 2020/0144535 A1* | 5/2020 | Kim | | H10K 59/65 |
| 2020/0176520 A1* | 6/2020 | Kim | | H10K 50/844 |
| 2020/0185660 A1* | 6/2020 | Kim | | H10K 59/12 |
| 2020/0194714 A1* | 6/2020 | Won | | H10K 59/123 |
| 2020/0212140 A1* | 7/2020 | Huh | | H01L 33/56 |
| 2020/0212155 A1* | 7/2020 | Mitani | | H10K 77/111 |
| 2020/0220098 A1* | 7/2020 | Tsai | | H10K 71/18 |
| 2020/0220101 A1* | 7/2020 | Moon | | H10K 77/111 |
| 2020/0235180 A1* | 7/2020 | Park | | H10K 59/124 |
| 2020/0287157 A1* | 9/2020 | Seong | | H10K 59/12 |
| 2020/0287162 A1* | 9/2020 | Chung | | H10K 50/115 |
| 2020/0295102 A1* | 9/2020 | Qin | | H10K 50/844 |
| 2020/0312933 A1* | 10/2020 | Lee | | H10K 71/231 |
| 2021/0005841 A1* | 1/2021 | Ohta | | H10K 50/8426 |
| 2021/0036064 A1* | 2/2021 | Jang | | H10K 59/131 |
| 2021/0050391 A1* | 2/2021 | Son | | H10K 71/221 |
| 2021/0151707 A1* | 5/2021 | Huang | | H10K 59/124 |
| 2021/0167330 A1* | 6/2021 | Lee | | H10K 50/844 |
| 2021/0193958 A1* | 6/2021 | Wang | | H10K 59/12 |
| 2021/0202626 A1* | 7/2021 | Jeon | | H10K 59/124 |
| 2021/0234122 A1* | 7/2021 | Choi | | F03D 7/0272 |
| 2021/0257434 A1* | 8/2021 | Xie | | H10K 77/111 |
| 2021/0336162 A1* | 10/2021 | Guo | | H10K 71/00 |
| 2021/0343981 A1* | 11/2021 | Xie | | H10K 59/8731 |
| 2021/0376290 A1* | 12/2021 | Zhang | | H10K 50/82 |
| 2021/0408508 A1* | 12/2021 | Zhang | | H10K 71/00 |
| 2022/0020958 A1* | 1/2022 | Okabe | | H10K 50/84 |
| 2022/0085329 A1* | 3/2022 | Wen | | H10K 59/124 |
| 2022/0085333 A1* | 3/2022 | Wen | | H10K 50/8445 |
| 2022/0102678 A1* | 3/2022 | Kim | | H10K 50/171 |
| 2022/0216283 A1* | 7/2022 | Kim | | H10K 59/131 |
| 2022/0271097 A1* | 8/2022 | Kim | | H10K 59/40 |
| 2022/0359854 A1* | 11/2022 | Zhang | | H10K 71/00 |
| 2022/0384540 A1* | 12/2022 | Qin | | H10K 71/00 |
| 2022/0393610 A1* | 12/2022 | Choi | | H02M 7/4835 |
| 2022/0399522 A1* | 12/2022 | Kim | | H10K 59/124 |
| 2023/0118675 A1* | 4/2023 | Kim | | G06F 3/04164 345/174 |

* cited by examiner

DISPLAY DEVICE

TECHNICAL FIELD

The disclosure relates to a display device.

BACKGROUND ART

In recent years, self-luminous type organic electroluminescence (EL) display devices in which organic EL elements are used have attracted attention as a display device that can replace a liquid crystal display device. For the organic EL display device, a seal structure is proposed to inhibit degradation of the organic EL element due to penetration of, for example, moisture and oxygen. The seal structure includes a sealing film covering the organic EL element, and the sealing film includes a stack of an inorganic film and an organic film. For example, PTL 1 discloses a display device including a thin film sealing layer. The thin film sealing layer has a layered structure in which an inorganic film layer formed through chemical vapor deposition (CVD) or the like, and an organic film layer formed through an ink-jet method or the like, are arranged in an alternating manner, and the thin film sealing layer covers an organic light-emitting element. This sealing film can prevent moisture from permeating a vapor deposition film, which is formed below the sealing film and is susceptible to moisture permeation.

CITATION LIST

Patent Literature

PTL 1: JP 2014-86415 A

SUMMARY

Technical Problem

Incidentally, in recent years, there has been a demand to provide a non-display region, which is an island-shaped through-hole, in order to arrange, for example, a camera or a fingerprint sensor inside a display region configured to display an image. This non-display region is provided inside the display region by forming, on a substrate, each layer, such as a vapor deposition film and a sealing film layered in an upper layer of the vapor deposition film, and subsequently forming a hole passing through each layer. However, when the non-display region is formed, a cut surface of the vapor deposition film susceptible to the permeation of moisture is also exposed in a cut surface of the non-display region, resulting in the problem that moisture permeates from the cut surface of the vapor deposition film susceptible to the permeation of moisture.

The disclosure has been made in view of the above, and an object of the disclosure is to ensure a sealing performance of a sealing film in a display device even if a non-display region having an island shape is provided inside a display region.

Solution to Problem

To achieve the above-described object, a display device according to the disclosure includes a base substrate, a thin film transistor layer provided on the base substrate and including an upper layer insulating film and an organic resin layer, a plurality of light-emitting elements provided on the thin film transistor layer and each including a common function layer formed continuously across each subpixel constituting a display region, a sealing film covering the plurality of light-emitting elements and including a first inorganic insulating film and a second inorganic insulating film layered in that order, a non-display region provided in an island shape in the display region, an opening provided in the non-display region and passing through the base substrate, a first frame-shaped protruding portion serving as the non-display region between the opening and the display region and provided on the upper layer insulating film in a circumferential shape along the opening, and an organic buffer layer provided on a side surface of the first frame-shaped protruding portion and interposed between the first inorganic insulating film and the second inorganic insulating film. The first frame-shaped protruding portion includes a portion where an area of a transverse section parallel to an upper face of the base substrate decreases from an upper face to a bottom face, the common function layer is also provided in the non-display region, and a slit surrounding the first frame-shaped protruding portion is formed in the common function layer provided in the non-display region.

Advantageous Effects of Disclosure

According to the disclosure, it is possible to ensure a sealing performance of a sealing film in a display device even if a non-display region having an island shape is provided inside a display region.

DESCRIPTION OF EMBODIMENTS

Embodiments of the disclosure will be described below in detail with reference to the drawings. Note that the disclosure is not limited to each embodiment to be described below. Note that, in each of the following embodiments, a display device including an organic EL element will be exemplified as a display device including a light-emitting element.

First Embodiment

Figure 1:
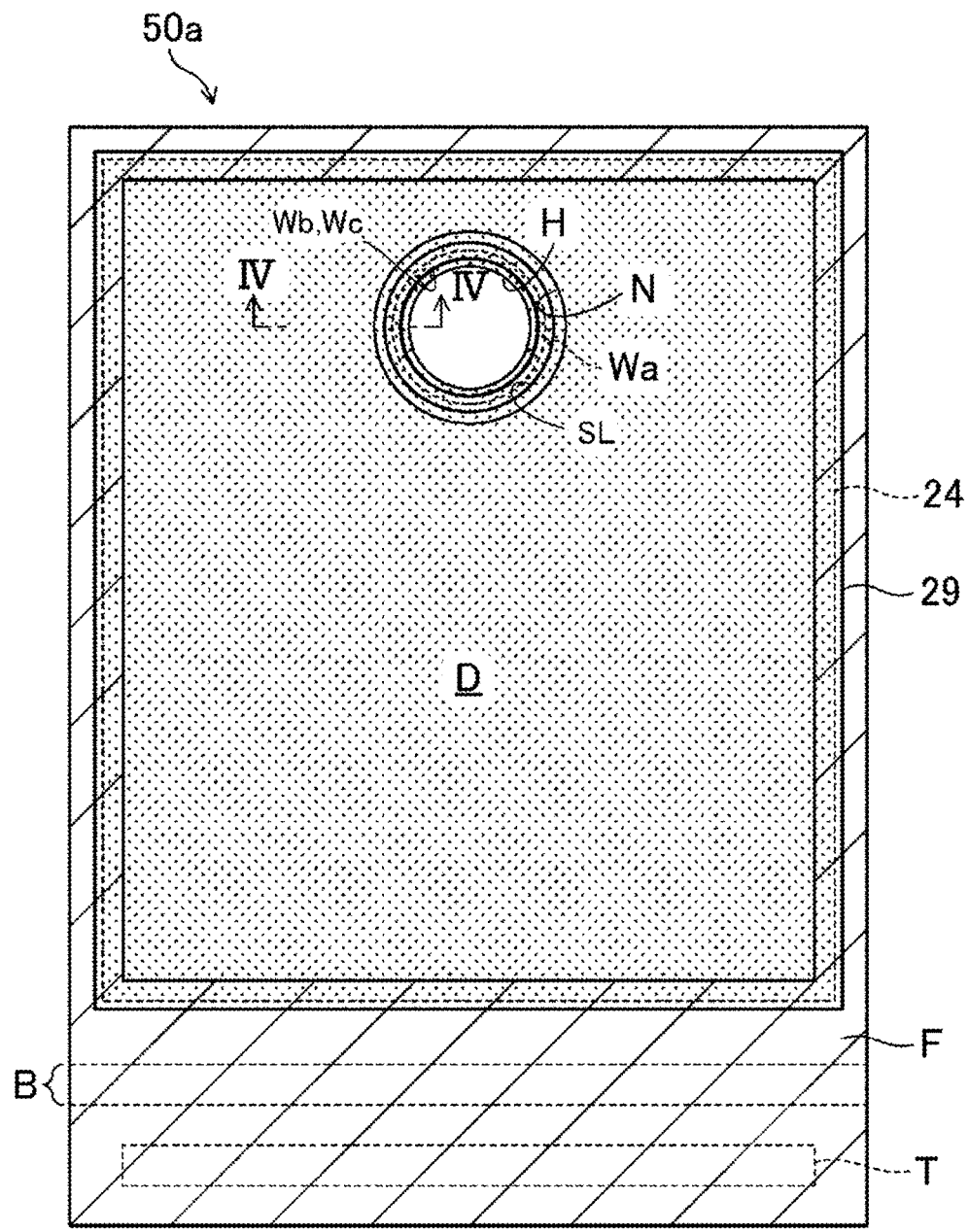
FIG. 1 is a plan view illustrating a schematic configuration of a display device according to an embodiment.
Figure 2:
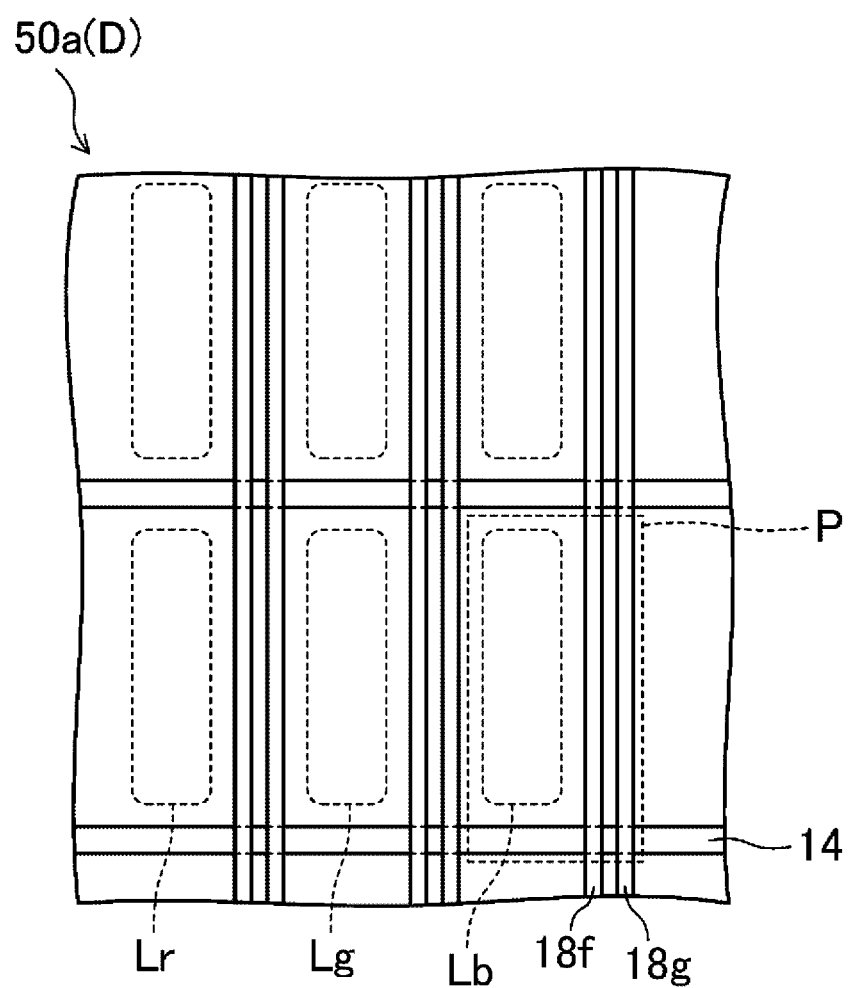
FIG. 2 is a plan view of a display region of the display device according to the embodiment.
Figure 3:
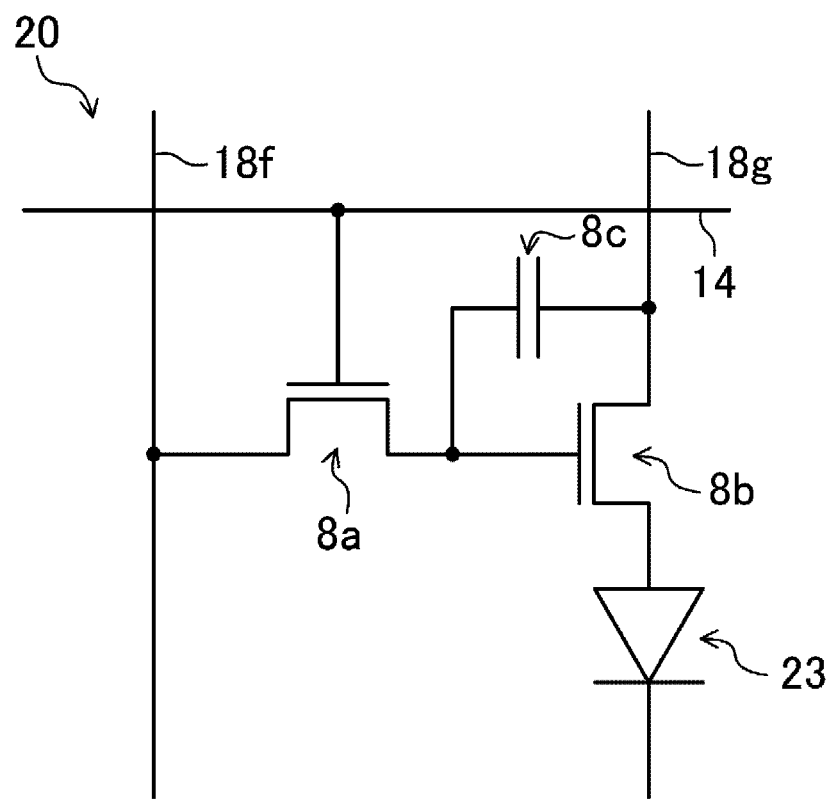
FIG. 3 is an equivalent circuit diagram illustrating a thin film transistor layer constituting the display device according to the embodiment.
Figure 4:
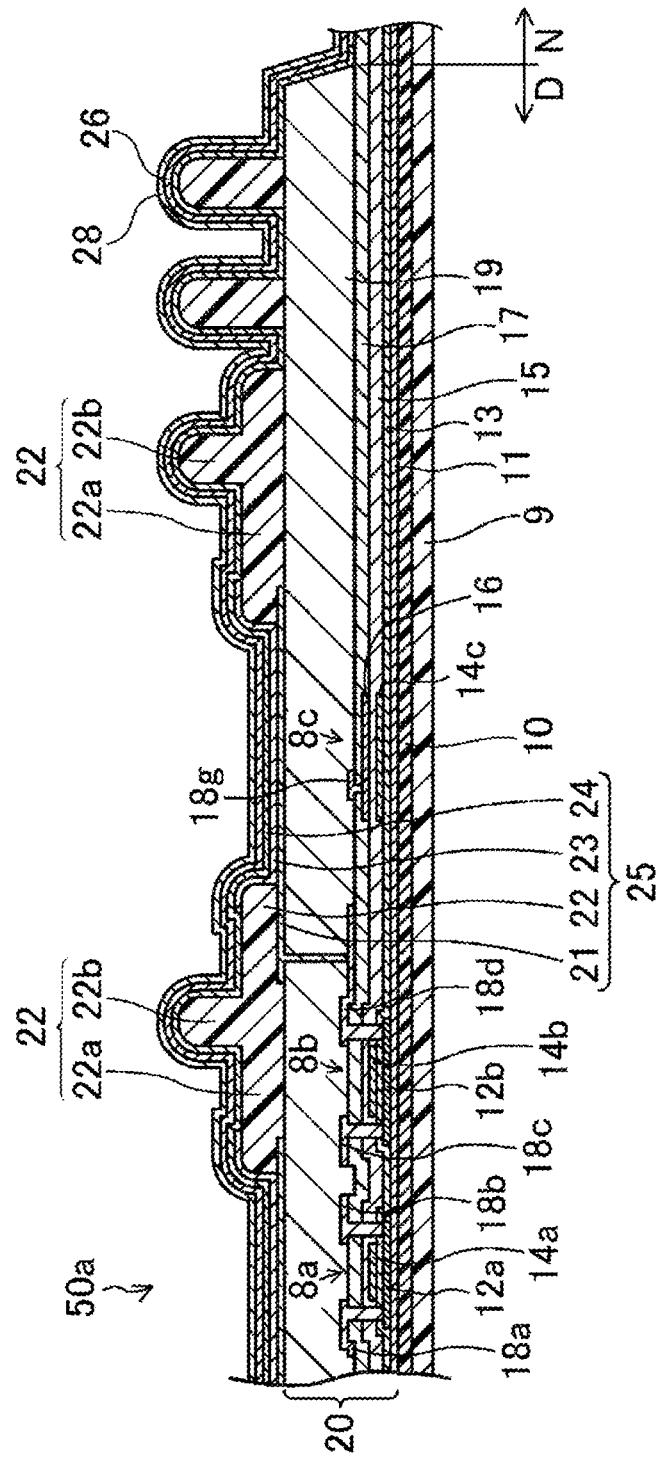
FIG. 4 is a cross-sectional view of the display region taken along line IV-IV in FIG. 1.
Figure 5:
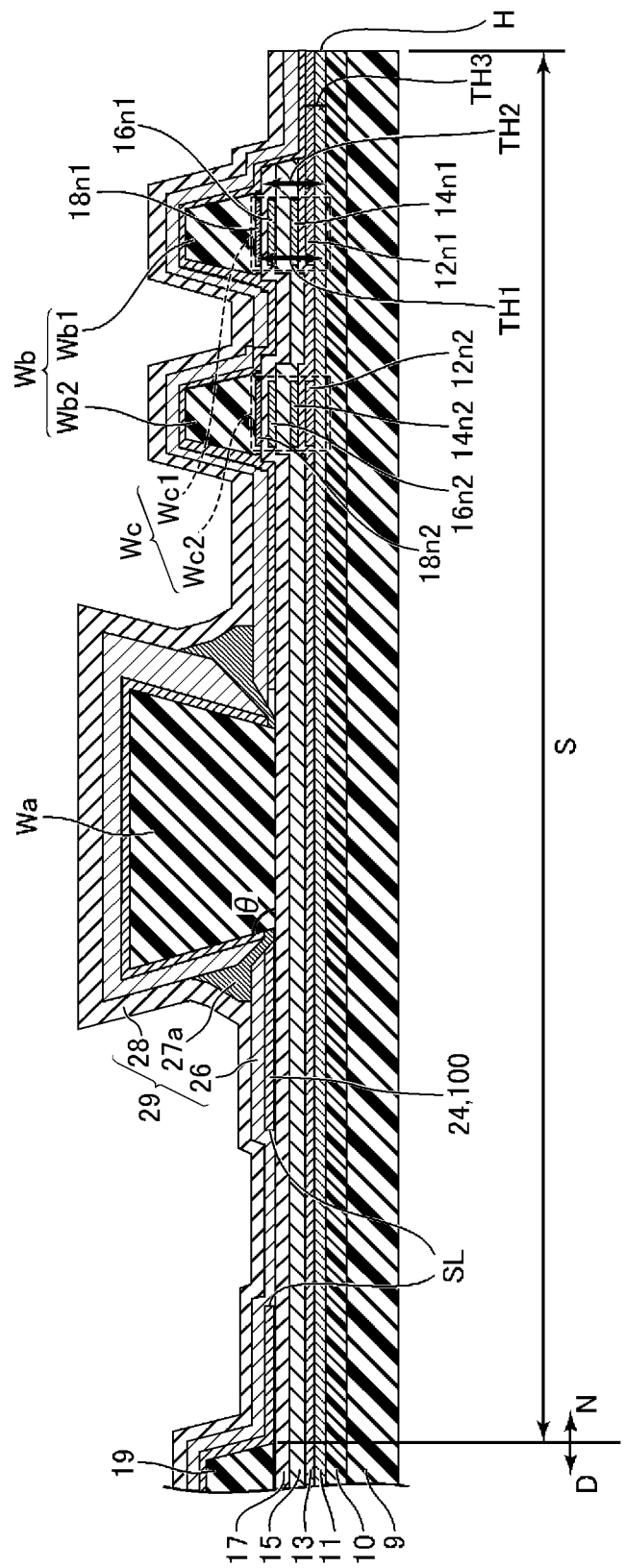
FIG. 5 is a cross-sectional view of a non-display region taken along line IV-IV in FIG. 1.
Figure 6:
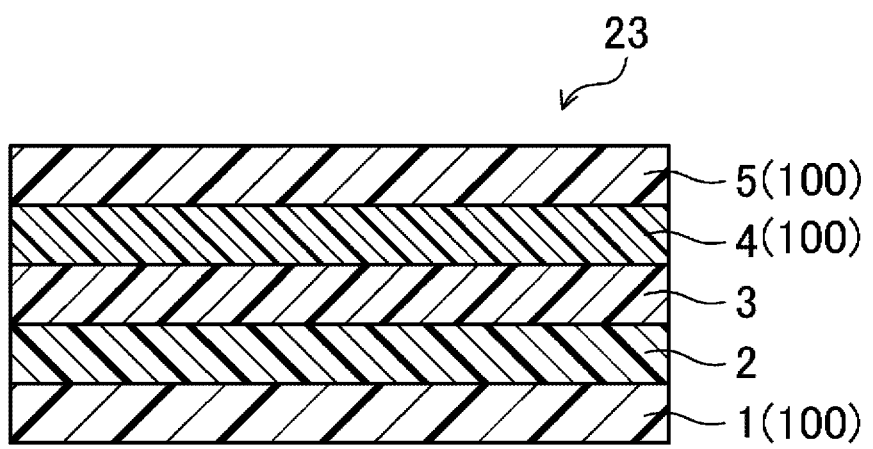
FIG. 6 is a cross-sectional view illustrating an organic EL layer constituting the display device according to the embodiment.

FIG. 1 is a plan view illustrating a schematic configuration of a display device 50a according to a first embodiment. FIG. 2 is a plan view of a display region D of the display device 50a. Further, FIG. 3 is an equivalent circuit diagram illustrating a thin film transistor layer 20 constituting the display device 50a. Further, FIG. 4 is a cross-sectional view of the display region D of the display device 50a taken along line IV-IV in FIG. 1. FIG. 5 is a cross-sectional view of a non-display region N of the display device 50a taken along line IV-IV in FIG. 1. Further, FIG. 6 is a cross-sectional view illustrating an organic EL layer 23 constituting the display device 50a. Note that, in FIG. 4, illustration of a common function layer 100 (refer to FIG. 5 and FIG. 6) described later is omitted.

As illustrated in FIG. 1, the display device 50a includes a display region D of an image having a rectangular shape, and a frame region F, which is a region having a frame-like shape surrounding the display region D.

In the display region D, an organic EL element 25 (refer to FIG. 4) described later is provided, and a plurality of subpixels P (refer to FIG. 2) are further arranged in a matrix shape. The subpixel P including a red light-emitting region Lr configured to display a red gray scale, the subpixel P including a green light-emitting region Lg configured to display a green gray scale, and the subpixel P including a blue light-emitting region Lb configured to display a blue gray scale are provided adjacent to one another, as illustrated in FIG. 2. One pixel is constituted by three adjacent subpixels P including the red light-emitting region Lr, the green light-emitting region Lg, and the blue light-emitting region Lb in the display region D. Further, as illustrated in FIG. 1, the non-display region N is provided in an island shape in the display region D. The term "island shape" refers to the non-display region N being isolated and provided in an interior of and enclosed by the display region D without coming into contact with an edge of the display region D.

As illustrated in FIG. 1 and FIG. 5, a through-hole (opening) H that passes through a resin substrate layer 10, described later, in a thickness direction, is provided in the non-display region N to allow arrangement of a camera or a fingerprint sensor, for example. As illustrated in FIG. 1 and FIG. 5, a first frame-shaped protruding portion Wa for separating a common function layer, which is a vapor deposition film formed on an entire surface of the substrate, such as a second electrode 24 described later, is provided in the non-display region N. The first frame-shaped protruding portion Wa is provided in the non-display region N, protrudes in the thickness direction of the resin substrate layer 10, is circular, and has a frame-like shape, extending along a boundary with the display region D.

The first frame-shaped protruding portion Wa is configured by, for example, layering a lower layer formed of the same material and in the same layer as those of a flattening film 19 described later, and an upper layer formed of the same material and in the same layer as those of an edge cover 22 (edge cover portion 22a and photo spacer portion 22b) described later. Further, the first frame-shaped protruding portion Wa has an angle θ formed by a bottom face and a side surface in a transverse section thereof (cross section cut in a direction orthogonal to a front face of the resin substrate layer 10; the cross section illustrated in FIG. 4) that is about from 70° to 150° and, as illustrated in FIG. 5, both side surfaces in the transverse section thereof are formed in an inversely tapered shape (preferably as in the drawing). The inversely tapered shape is a shape in which a distance between both side surfaces gradually narrows in the transverse section of the first frame-shaped protruding portion Wa, from a top face (upper face) to a bottom face. Note that it is sufficient that both side surfaces of the first frame-shaped protruding portion Wa include at least a portion from the top face to the bottom face in which the distance gradually narrows from the top face to the bottom face.

Further, a distance S from a side wall of the through-hole H to an edge of the display region D is about from 100 μm to 500 μm. Note that, in a case in which the organic film between the first inorganic film and the second inorganic film constituting the sealing film is formed by an ink-jet method, a structure corresponding to the first frame-shaped protruding portion Wa is required in double in order to dam the organic film, and thus the corresponding distance from the side wall of the through-hole H to the edge of the display region D is about 600 μm.

Further, as illustrated in FIG. 1 and FIG. 5, a slit SL for more reliably separating, in the non-display region N, a film formed on the entire surface of the substrate such as the second electrode 24 and the common function layer 100 described later is provided in the non-display region. The slit SL is provided in both the second electrode 24 and the common function layer 100 so as to form a circular frame-like shape surrounding the first frame-shaped protruding portion Wa, between the first frame-shaped protruding portion Wa and the display region D, in the non-display region N.

Further, as illustrated in FIG. 1 and FIG. 5, a second frame-shaped protruding portion Wb and a thick film portion We that are structures for preventing cracks from occurring in the inorganic films of the thin film transistor layer 20 may be provided between the first frame-shaped protruding portion Wa and the through-hole H, in the non-display region N.

The second frame-shaped protruding portion Wb is, as illustrated in FIG. 1 and FIG. 5, for example, formed of the same material and in the same layer as those of the flattening film 19 described later, and protrudes in the thickness direction of the resin substrate layer 10. For example, the second frame-shaped protruding portion Wb may include a first protruding portion Wb1 of an inner peripheral side disposed on an inner peripheral side and a second protruding portion Wb2 on an outer peripheral side surrounding an outer periphery of the first protruding portion Wb1. Note that, in the present embodiment, the second frame-shaped protruding portion Wb is described as including the first protruding portion Wb1 and the second protruding portion Wb2 having a double frame-like shape, but may include only one protruding portion having a single frame-like shape, or may include protruding portions having a triple frame-like shape or greater. Further, the second frame-shaped protruding portion Wb need only be formed of an organic film, and may be formed of the same material and in the same layer as those of the edge cover 22 described later, rather than of the same material and in the same layer as those of the flattening film 19. The second frame-shaped protruding portion Wb may have a height lower than that of the first frame-shaped protruding portion Wa.

The second frame-shaped protruding portion Wb is formed of an organic resin such as a polyimide resin, a polyamide resin, and an acrylic resin. Due to the structure of this second frame-shaped protruding portion Wb, a first inorganic film 26 and a second inorganic film 28 of a sealing film 29 extend in appearance from the through-hole H to the display region D, making it possible to prevent crack transmission.

The thick film portion Wc is formed of an inorganic film such as an inorganic insulating film, a semiconductor layer, or a metal layer, for example. These inorganic films have acoustic capacities (inversely proportional to the product of the sound velocity squared and density) that are substantially of the same order in magnitude, and crack transmission can be prevented by providing an inorganic film (thick film portion Wc) having a thick film thickness on the display region D side from the inorganic film having a thin film thickness on the through-hole H side. In the present embodiment, the thick film portion Wc is formed in a lower layer of the second frame-shaped protruding portion Wb, as illustrated in FIG. 1 and FIG. 5. As illustrated in FIG. 1 and FIG. 5, for example, the thick film portion Wc is configured by layering a base coat film 11, semiconductor layers 12$n$1, 12$n$2, a gate insulating film 13, first metal portions 14$n$1, 14$n$2, a first interlayer insulating film 15, second metal portions 16$n$1, 16$n$2, a second interlayer insulating film 17, and third metal portions 18$n$1, 18$n$2 described later, or by layering at least a portion of these layers. As described later, the semiconductor layers 12$n$1, 12$n$2 are formed of the same material and in the same layer as those of the semiconductor layers 12$a$, 12$b$. The first metal portions 14$n$1, 14$n$2 are formed of the same material and in the same layer as those of the gate electrodes 14$a$, 14$b$. The second metal portions 16$n$1, 16$n$2 are formed of the same material and in the same layer as those of an upper conductive layer 16. The third metal portions 18$n$1, 18$n$2 are formed of the same material and in the same layer as those of a power source line 18$g$. For example, the thick film portion Wc may include a first thick film portion Wc1 disposed on an inner peripheral side and a second thick film portion Wc2 surrounding an outer periphery of the first thick film portion Wc1. Note that, in the present embodiment, the thick film portion Wc is described as including the first thick film portion Wc1 and the second thick film portion Wc2 having a double frame-like shape, but may include only one thick film portion having a single frame-like shape, or may include thick film portions having a triple frame-like shape or greater.

In the present embodiment, the second frame-shaped protruding portion Wb is provided overlapping the thick film portion Wc, but the second frame-shaped protruding portion Wb need not be provided overlapping the thick film portion Wc. Further, only one of the second frame-shaped protruding portion Wb and the thick film portion Wc may be provided.

A terminal region T is provided in one end portion of the frame region F (end portion on a lower side in FIG. 1), as illustrated in FIG. 1. Further, between the display region D and the terminal region T in the frame region F, a bending portion B being bendable at 180 degrees (in a U shape) while taking a horizontal direction in the drawing as a bending axis, is provided along one side (lower side in the figure) of the display region D. Note that, in the present embodiment, the display device 50$a$ provided with the bending portion B is illustrated, but the bending portion B may be omitted. After the thin film transistor layer (refer to FIG. 4) 20 is formed, the bending portion B is formed by forming a groove obtained by removing the thin film transistor layer 20 in the formation region of the bending portion B in a groove shape, and filling the groove with a filling layer composed of a resin material.

As illustrated in FIG. 4, the display device 50$a$ includes a film 9 and the resin substrate layer 10 provided as a base substrate having flexibility, the organic EL element 25 provided, on the resin substrate layer 10, as a light-emitting element with the thin film transistor layer 20 interposed therebetween, and the sealing film 29 provided covering the organic EL element 25.

The film 9 is constituted by a flexible material, such as polyethylene terephthalate (PET), for example. The resin substrate layer 10 is provided on the film 9 and constituted by a polyimide resin or the like, for example.

The thin film transistor layer 20 includes the base coat film 11 provided on the resin substrate layer 10, a plurality of first thin film transistors 8$a$, a plurality of second thin film transistors 8$b$, and a plurality of capacitors 8$c$ provided on the base coat film 11, and the flattening film (organic resin layer) 19 provided on each first thin film transistor 8$a$, each second thin film transistor 8$b$, and each capacitor 8$c$. Here, in the thin film transistor layer 20, as illustrated in FIG. 2 and FIG. 3, a plurality of gate lines 14 are provided extending parallel to each other in a horizontal direction in the figures. Further, in the thin film transistor layer 20, as illustrated in FIG. 2 and FIG. 3, a plurality of source lines 18$f$ are provided extending parallel to each other in a vertical direction in the figures. Further, in the thin film transistor layer 20, as illustrated in FIG. 2 and FIG. 3, a plurality of the power source lines 18$g$ are provided extending parallel to each other in the vertical direction in the figures while being disposed adjacent to each source line 18$f$. Further, in the thin film transistor layer 20, each subpixel P includes the first thin film transistor 8$a$, the second thin film transistor 8$b$, and the capacitor 8$c$, as illustrated in FIG. 3.

The base coat film 11 is formed of a single-layer film or a layered film of an inorganic insulating film made of, for example, silicon nitride, silicon oxide, silicon oxynitride, or the like.

The first thin film transistor 8$a$ is connected to the corresponding gate line 14 and source line 18$f$ in each subpixel P, as illustrated in FIG. 3. Here, as illustrated in FIG. 4, the first thin film transistor 8$a$ includes a semiconductor layer 12$a$ provided in an island shape on the base coat film 11, the gate insulating film 13 provided covering the semiconductor layer 12$a$, a gate electrode 14$a$ provided on the gate insulating film 13 to overlap a portion of the semiconductor layer 12$a$, the first interlayer insulating film (lower layer electrode) 15 and the second interlayer insulating film (upper layer insulating film) 17 provided in that order to cover the gate electrode 14$a$, and a source electrode 18$a$ and a drain electrode 18$b$ provided on the second interlayer insulating film 17 and disposed spaced apart from each other. Note that the gate insulating film 13, the first interlayer insulating film 15, and the second interlayer insulating film 17 are each constituted by a single-layer film or a layered film of an inorganic insulating film of, for example, silicon nitride, silicon oxide, or silicon oxynitride.

The second thin film transistor 8$b$ is connected to the corresponding first thin film transistor 8$a$ and power source line 18$g$ in each subpixel P, as illustrated in FIG. 3. Here, as illustrated in FIG. 4, the second thin film transistor 8$b$ includes the semiconductor layer 12$b$ provided in an island shape on the base coat film 11, the gate insulating film 13 provided covering a semiconductor layer 12b, a gate electrode 14b provided on the gate insulating film 13 to overlap a portion of the semiconductor layer 12b, the first interlayer insulating film 15 and the second interlayer insulating film 17 provided in that order to cover the gate electrode 14b, and a source electrode 18c and a drain electrode 18d provided on the second interlayer insulating film 17 disposed spaced apart from each other.

Note that, although the first thin film transistor 8a and the second thin film transistor 8b of a top gate type are exemplified in the present embodiment, the first thin film transistor 8a and the second thin film transistor 8b may be thin film transistors of a bottom gate type.

The capacitor 8c is connected to the corresponding first thin film transistor 8a and power source line 18g in each subpixel P, as illustrated in FIG. 3. Here, as illustrated in FIG. 4, the capacitor 8c includes a lower conductive layer 14c formed of the same material and in the same layer as those of the gate electrode, the first interlayer insulating film 15 provided covering the lower conductive layer 14c, and the upper conductive layer 16 provided on the first interlayer insulating film 15 to overlap the lower conductive layer 14c. Note that, the upper conductive layer 16 is connected to the power source line 18g through a contact hole formed in the second interlayer insulating film 17 as illustrated in FIG. 4.

The flattening film 19 is formed of, for example, a colorless and transparent organic resin material, such as a polyimide resin.

The organic EL element 25 includes, as illustrated in FIG. 4, a plurality of first electrodes 21, the edge cover 22, a plurality of the organic EL layers 23, and the second electrode 24 provided in that order on the flattening film 19.

As illustrated in FIG. 4, the plurality of first electrodes 21 are provided in a matrix shape on the flattening film 19, correspondingly to the plurality of subpixels P, as reflective electrodes (anode electrode). Here, the first electrode 21 is connected to the drain electrode 18d of each second thin film transistor 8b via a contact hole formed in the flattening film 19, as illustrated in FIG. 4. In addition, the first electrodes 21 have a function of injecting holes (positive holes) into the organic EL layer 23. In addition, the first electrodes 21 are preferably formed of a material with a high work function to improve the efficiency of hole injection into the organic EL layer 23. Here, examples of materials constituting the first electrode 21 include metallic materials, for example, silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), lithium fluoride (LiF), and the like. As materials constituting the first electrode 21, there may be adopted alloys of, for example, magnesium (Mg)-copper (Cu), magnesium (Mg)-silver (Ag), sodium (Na)-potassium (K), astatine (At)-astatine oxide (AtO2), lithium (Li)-aluminum (Al), lithium (Li)-calcium (Ca)-aluminum (Al), or lithium fluoride (LiF)-calcium (Ca)-aluminum (Al). Furthermore, a material constituting the first electrodes 21 may be electrically conductive oxide, for example, tin oxide (SnO), zinc oxide (ZnO), indium tin oxide (ITO), or indium zinc oxide (IZO). In addition, the first electrodes 21 may be formed by layering a plurality of layers formed of any of the materials described above. Note that, examples of materials having the high work function include indium tin oxide (ITO), indium zinc oxide (IZO), and the like.

As illustrated in FIG. 4, the edge cover 22, in the present embodiment, includes the edge cover portion 22a provided in a lattice pattern covering a peripheral portion of each first electrode 21, and the photo spacer portion 22b. The photo spacer portion 22b has a shape that protrudes from the edge cover portion 22a in a columnar shape. Here, examples of a material constituting the edge cover 22 include organic films of, for example, a polyimide resin, an acrylic resin, a polysiloxane resin, a novolak resin, and the like. In the present embodiment, an example is illustrated in which the edge cover portion 22a and the photo spacer portion 22b of the edge cover 22 are formed of a resin layer, which is the same material, all at once using a halftone mask or the like. On the other hand, the edge cover portion 22a and the photo spacer portion 22b may be divided and formed into two layers (that is, in different processes and of different materials) and, in this case as well, the edge cover 22 in the present embodiment includes the edge cover portion 22a and the photo spacer portion 22b.

The plurality of organic EL layers 23 are disposed on each of the first electrodes 21 as illustrated in FIG. 4 and are provided in a matrix shape to correspond to the plurality of subpixels.

Each organic EL layer 23 includes a hole injection layer 1, a hole transport layer 2, a light-emitting layer 3, an electron transport layer 4, and an electron injection layer 5, which are provided in that order on the first electrode 21, as illustrated in FIG. 6. Note that the hole injection layer 1, the hole transport layer 2, the light-emitting layer 3, the electron transport layer 4, and the electron injection layer 5 are vapor deposition films formed by a vacuum vapor deposition technique, for example. Further, an electron blocking layer configured to prevent electrons from flowing toward the first electrode 21 may be provided between the hole injection layer 1 and the light-emitting layer 3.

Here, each layer provided between the first electrode 21 and the second electrode 24 is referred to as a function layer. The function layers are, for example, the hole injection layer 1, the hole transport layer 2, the light-emitting layer 3, the electron transport layer 4, the electron injection layer 5, the electron blocking layer, and a cap layer. The function layers may be further divided into the common function layers 100 and separate function layers.

The common function layer 100 is a vapor deposition film formed continuously across the plurality of subpixels P. The common function layer 100 is formed using a common metal mask (CMM) of the function layers. The CMM is a mask in which one opening is provided correspondingly to one display device 50a, and thus cannot provide a pattern that blocks the region corresponding to the through-hole H. Therefore, the common function layers 100 are also deposited on the region corresponding to the through-hole H. The common function layers 100 are, for example, the hole injection layer 1, the electron blocking layer, the electron transport layer 4, and the electron injection layer 5. Further, the light-emitting layer 3 may also serve as the common function layer 100 formed on the entire surface of the substrate, continuously across the subpixels P.

The separate function layer is a function layer formed correspondingly to the subpixels P using a fine metal mask (FMM; not limited to each subpixel P and also includes a function layer common to a plurality of pixels such as RG, for example). The FMM is a mask in which a plurality of openings are provided in positions and shapes corresponding to each subpixel P. The separate function layers are, for example, the hole transport layer 2 and the light-emitting layer 3.

The hole injection layer 1 is also referred to as an anode electrode buffer layer, and functions to reduce an energy level difference between the first electrodes 21 and the organic EL layers 23 to thereby improve the efficiency of hole injection into the organic EL layers 23 from the first electrodes 21. Here, examples of materials constituting the hole injection layer 1 include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, stilbene derivatives, and the like.

The hole transport layer 2 functions to improve the efficiency of hole transport from the first electrodes 21 to the organic EL layers 23. Here, examples of materials constituting the hole transport layer 2 include porphyrin derivatives, aromatic tertiary amine compounds, styrylamine derivatives, polyvinylcarbazole, poly-p-phenylenevinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, zinc selenide, and the like.

The light-emitting layer 3 is a region where holes and electrons are injected from the first electrode 21 and the second electrode 24, respectively, and the holes and the electrons recombine, when a voltage is applied via the first electrode 21 and the second electrode 24. Here, the light-emitting layer 3 is formed of a material having high light-emitting efficiency.

In the present embodiment, the light-emitting layer 3 is described as a layer that emits any one of red light, green light, and blue light, and is provided on each subpixel P. However, in a case in which a color conversion layer including quantum dots is used in addition to the light-emitting layer 3, for example, the light-emitting layer 3 may be a layer that emits light of one color of blue light or one color of near-ultraviolet light. Furthermore, the light-emitting layer 3 in which the light-emitting layer 3 thus emits the light of one color may serve as the common function layer 100 formed on the entire surface of the substrate, continuously across the subpixels P, rather than being formed for each subpixel p.

Examples of materials constituting the light-emitting layer 3 include metal oxinoid compounds (8-hydroxyquinoline metal complexes), naphthalene derivatives, anthracene derivatives, diphenyl ethylene derivatives, vinyl acetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, trisstyrylbenzene derivatives, perylene derivatives, perinone derivatives, aminopyrene derivatives, pyridine derivatives, rhodamine derivatives, aquidine derivatives, phenoxazone, quinacridone derivatives, rubrene, poly-p-phenylenevinylene, polysilane, and the like.

The electron transport layer 4 functions to facilitate migration of electrons to the light-emitting layer 3 efficiently. Here, examples of materials constituting the electron transport layer 4 include oxadiazole derivatives, triazole derivatives, benzoquinone derivatives, naphthoquinone derivatives, anthraquinone derivatives, tetracyanoanthraquinodimethane derivatives, diphenoquinone derivatives, fluorenone derivatives, silole derivatives, metal oxinoid compounds, and the like, as organic compounds.

The electron injection layer 5 functions to reduce an energy level difference between the second electrode 24 and the organic EL layer 23 to thereby improve the efficiency of electron injection into the organic EL layer 23 from the second electrode 24, and the electron injection layer 5 can lower the drive voltage of the organic EL element 25 by this function. Note that the electron injection layer 5 is also referred to as a cathode buffer layer. Examples of materials that may constitute the electron injection layer 5 include inorganic alkali compounds such as lithium fluoride (LiF), magnesium fluoride (MgF2), calcium fluoride (CaF2), strontium fluoride (SrF2) and barium fluoride (BaF2), aluminum oxide (Al2O3), and strontium oxide (SrO).

As illustrated in FIG. 1, the second electrode 24 (dotted portion in the figure) is provided as a common electrode (cathode electrode), covering each of the organic EL layers 23 and the edge cover 22. The second electrode 24 is formed using a CMM (Common Metal Mask). As illustrated in FIG. 1, FIG. 4, and FIG. 5, the second electrode 24 (dotted portion in FIG. 1) is also provided in the non-display region N. The second electrode 24 is formed covering the first frame-shaped protruding portion Wa and the second frame-shaped protruding portion Wb in the non-display region N. Further, as illustrated in FIG. 5, at least one of the second electrode 24 and the common function layer 100 is formed disconnected by a step in the non-display region N at a side surface or a base portion vicinity of the first frame-shaped protruding portion Wa due to the inversely tapered shape of the first frame-shaped protruding portion Wa. Then, as illustrated in FIG. 1 and FIG. 5, the slit SL having a frame shape and surrounding an outer periphery of the first frame-shaped protruding portion Wa is provided in both the second electrode 24 and the common function layer 100 provided in the non-display region N.

Note that, in the present embodiment, an example is described in which, of the common function layer 100 and the second electrode 24, the second electrode 24 is disconnected by a step at the side surface or the base portion vicinity of the first frame-shaped protruding portion Wa and provided with the slit SL.

The second electrode 24 functions to inject electrons into the organic EL layer 23. In addition, the second electrode 24 is preferably formed of a material with a low work function to improve the efficiency of electron injection into the organic EL layer 23. Further, the second electrode 24 is a vapor deposition film formed by a vacuum vapor deposition technique, for example. The slit SL provided in the second electrode 24 and the like is formed by, for example, irradiating the second electrode 24 with laser light.

Examples of materials constituting the second electrode 24 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), lithium fluoride (LiF), and the like. The second electrode 24 may be formed of alloys such as alloys of magnesium (Mg)-copper (Cu), magnesium (Mg)-silver (Ag), sodium (Na)-potassium (K), astatine (At)-astatine oxide (AtO2), lithium (Li)-aluminum (Al), lithium (Li)-calcium (Ca)-aluminum (Al), and lithium fluoride (LiF)-calcium (Ca)-aluminum (Al), for example. In addition, the second electrode 24 may be formed of electrically conductive oxide, for example, tin oxide (SnO), zinc oxide (ZnO), indium tin oxide (ITO), indium zinc oxide (IZO), or the like. In addition, the second electrode 24 may be formed by layering a plurality of layers formed of any of the materials described above. Note that examples of materials having a low work function include magnesium (Mg), lithium (Li), lithium fluoride (LiF), magnesium (Mg)/copper (Cu), magnesium (Mg)/silver (Ag), sodium (Na)/potassium (K), lithium (Li)/aluminum (Al), lithium (Li)/calcium (Ca)/aluminum (Al), lithium fluoride (LiF)/calcium (Ca)/aluminum (Al), and the like.

As illustrated in FIG. 4 and FIG. 5, the sealing film 29 includes the first inorganic film 26 provided covering the second electrode 24, an organic buffer layer 27a provided on the first inorganic film 26, and the second inorganic film 28 provided on the first inorganic film 26 to cover the organic buffer layer 27a, and functions to protect the organic EL layer 23 from moisture, oxygen, and the like. The sealing film 29 has a configuration in which the first inorganic film 26 and the second inorganic film 28 are layered except in the portion where the organic buffer layer 27a is formed.

The first inorganic film 26 and the second inorganic film 28 are constituted by an inorganic material such as, for example, silicon oxide (SiO2) or aluminum oxide (Al2O3), silicon nitride (SiNx (x denoting a positive integer)) like trisilicon tetranitride (Si3N4), or silicon carbide nitride (SiCN).

The organic buffer layer 27a is constituted by an organic material such as an acrylate, polyurea, parylene, polyimide, or polyamide, for example. Further, as illustrated in FIG. 5, the organic buffer layer 27a is provided on the side surface of the first frame-shaped protruding portion Wa of the non-display region N. Then, the organic buffer layer 27 is provided interposed between the first inorganic film 26 and the second inorganic film 28, on the side surface of the first frame-shaped protruding portion Wa. Note that, due to the inversely tapered shape of the side surface of the first frame-shaped protruding portion Wa, the first inorganic film 26 is formed disconnected by a step and thus, as illustrated in FIG. 5, the portion where the first inorganic film 26 is disconnected by a step is filled with the organic buffer layer 27a. Therefore, the organic buffer layer 27a is in contact with the side surface of the first frame-shaped protruding portion Wa or is in contact with the second interlayer insulating film 17 in the base portion vicinity of the first frame-shaped protruding portion Wa, in accordance with the portion where the first inorganic film 26 is disconnected by a step. Further, the organic buffer layer 27a is also provided on front faces of foreign matters adhered on the first inorganic film 26.

The display device 50a described above is configured such that, in each subpixel P, a gate signal is input to the first thin film transistor 8a via the gate line 14 to thereby set the first thin film transistor 8a to an on state, a predetermined voltage corresponding to a source signal is written in the gate electrode 14b of the second thin film transistor 8b and the capacitor 8c via the source line 18f, a current is specified in size from the power source line 18g on the basis of a gate voltage of the second thin film transistor 8b, the specified current is supplied to the organic EL layer 23, and thereby the light-emitting layer 3 of the organic EL layer 23 emits light to display an image. Note that, in the display device 50a, because a gate voltage of the second thin film transistor 8b is held by the capacitor 8c even when the first thin film transistor 8a is set to an off state, the light-emitting layer 3 keeps emitting light until a gate signal of the next frame is input.

Figure 7:
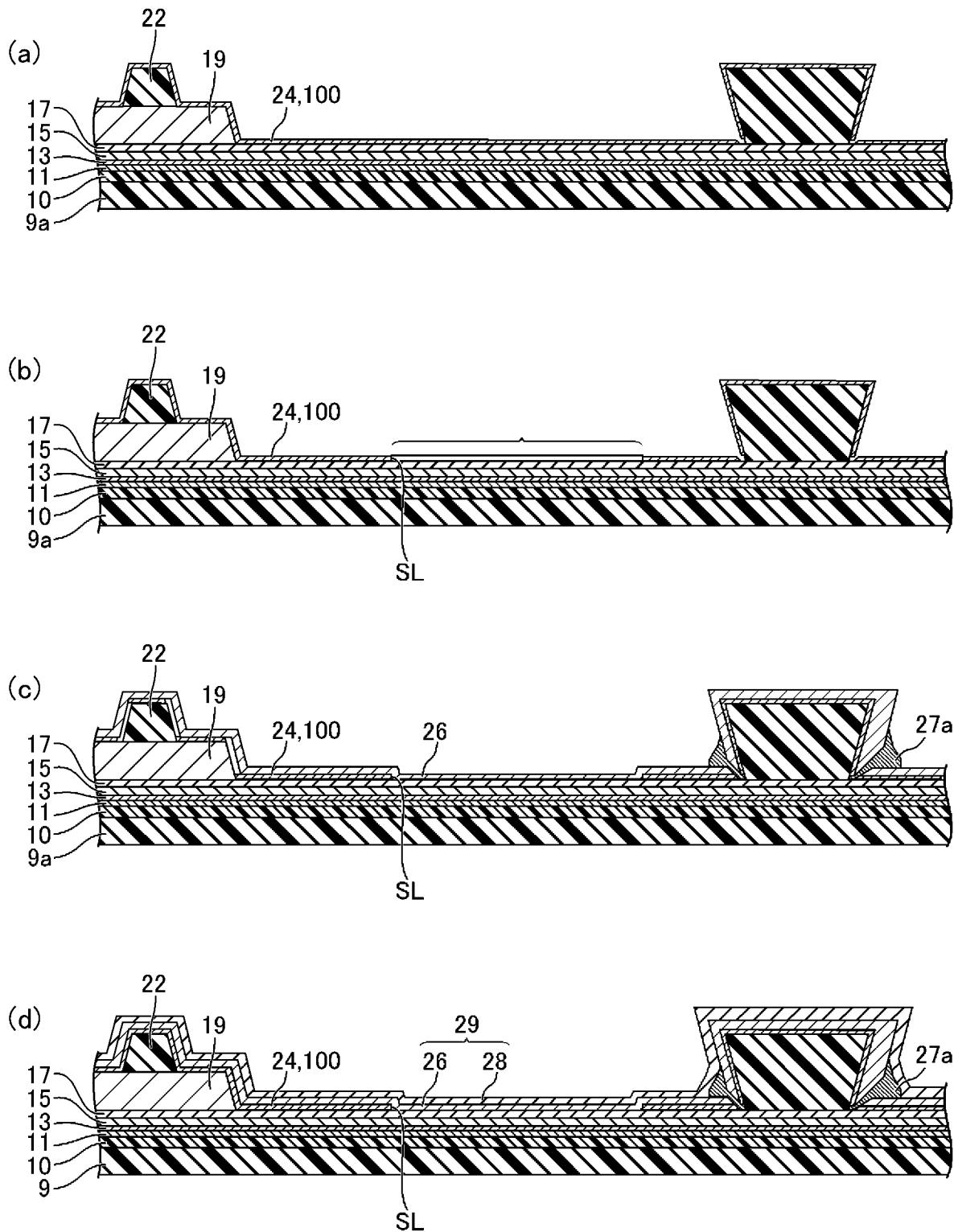
FIG. 7 is a diagram illustrating a manufacturing process of the display device according to the embodiment.

Next, a method of manufacturing the display device 50a according to the present embodiment will be described using FIG. 7. Here, FIG. 7 is a drawing for explaining the sealing film formation process of the manufacturing process of the display device 50a. FIG. 7(a) is a drawing illustrating a second electrode formation process of the manufacturing process of the display device 50a, FIG. 7(b) is a drawing illustrating a slit formation process of the manufacturing process of the display device 50a, FIG. 7(c) is a drawing illustrating a first inorganic film formation process and an organic film formation process of the manufacturing process of the display device 50a, and FIG. 7(d) is a drawing illustrating a second inorganic film formation process of the manufacturing process of the display device 50a. Note that the method of manufacturing the display device 50a according to the present embodiment includes a thin film transistor layer formation process, a light-emitting element formation process, a sealing film formation process, a flexing process, and a through-hole formation process. The light-emitting element layer formation process includes a first frame-shaped protruding portion formation process, a second electrode formation process, and a slit formation process. The sealing film formation process includes a first inorganic film formation process, an organic film formation process, an ashing process, and a second inorganic film formation process.

Thin Film Transistor Layer Formation Process

As illustrated in FIG. 4 and FIG. 5, for example, the thin film transistor layer 20 is formed on the front face of the resin substrate layer 10 formed on a glass substrate 9a by forming the base coat film 11, the first thin film transistor 8a, the second thin film transistor 8b, the capacitor 8c, and the flattening film 19 by using a known method.

The semiconductor layer 12n1 of the first thick film portion Wc1 and the semiconductor layer 12n2 of the thick film portion Wc2 are formed of the same material and in the same layer (on the base coat film 11) as those of the semiconductor layers 12a, 12b of the first thin film transistor 8a and the second thin film transistor 8b, in a frame-like shape in the non-display region N. Note that, of the semiconductor layers 12n1, 12b, the semiconductor layer 12n1 formed on the inner peripheral side (side closer to the through-hole H) subsequently functions as an etching stopper that protects the base coat film 11 and the resin substrate layer 10 from etching, and thus the width may be formed wider than that of the first thick film portion Wc1 and may be such that one end portion is exposed through the through-hole H.

Further, the first metal portion 14n1 of the first thick film portion Wc1 and the first metal portion 14n2 of the second thick film portion Wc2 are formed of the same material and in the same layer (on the gate insulating film 13) as those of the gate electrodes 14a, 14b of the first thin film transistor 8a and the second thin film transistor 8b, in a frame-like shape in the non-display region N. The first metal portion 14n1 is narrower than the semiconductor layer 12n1 and formed overlapping a portion of the semiconductor layer 12n1. The first metal portion 14n2 has about the same width as that of the semiconductor layer 12n2, and is formed overlapping the semiconductor layer 12n2.

Further, the second metal portion 16n1 of the first thick film portion Wc1 and the second metal portion 16n2 of the second thick film portion Wc2 are formed of the same material and in the same layer (on the first interlayer insulating film 15) as those of the upper conductive layer 16, in a frame-like shape in the non-display region N. The second metal portion 16n1 has about the same width as that of the first metal portion 14n1, and is formed overlapping the first metal portion 14n1. The second metal portion 16n2 has about the same width as that of the first metal portion 14n2, and is formed overlapping the first metal portion 14n2.

Further, the third metal portion 18n1 of the first thick film portion Wc1 and the third metal portion 18n2 of the second thick film portion Wc2 are formed of the same material and in the same layer (on the second interlayer insulating film 17) as those of the power source line 18 g, in a frame-like shape in the non-display region N. The third metal portion 18n1 has about the same width as that of the second metal portion 16n1, and is formed overlapping the second metal portion 16n1. The third metal portion 18n2 has about the same width as that of the second metal portion 16n2, and is formed overlapping the second metal portion 16n2.

Further, after the gate insulating film 13, the first interlayer insulating film 15, and the second interlayer insulating film 17 are formed on the entire surface of the substrate front face, including the display region D and the non-display region N, the region on the inner peripheral side of the first thick film portion Wc1 (region from the through-hole H to the first thick film portion Wc1) in the non-display region N is preferably removed by etching or the like in a circular shape. As a result, when the through-hole H is formed inward of the first thick film portion Wc1, it is possible to reduce the number of layers of inorganic film and prevent cracks from occurring in the inorganic films of the thin film transistor layer 20.

Here, the width of the semiconductor layer 12n1 is a width that covers the base coat film 11 formed in the region on the inner peripheral side of the first thick film portion Wc1 (region from the through-hole H to the first thick film portion Wc1) and thus, when the gate insulating film 13, the first interlayer insulating film 15, and the second interlayer insulating film 17 of the region on the inner peripheral side of the first thick film portion Wc1 (region from the through-hole H to the first thick film portion Wc1) are removed by etching or the like, the semiconductor layer 12n1 can function as an etching stopper. This makes it possible to prevent the base coat film 11 and the resin substrate layer 10 in the region inward of the first thick film portion Wc1 (region from the through-hole H to the first thick film portion Wc1) from being removed.

Further, each of the first thick film portion Wc1 and the second thick film portion Wc2 is configured so that the film thicknesses of the plurality of inorganic films included in the thin film transistor layer 20 are formed thicker than the film thickness of the plurality of inorganic films included in the thin film transistor layer 20 surrounding the first thick film portion Wc1 and the second thick film portion Wc2.

As a specific example, the inorganic film included in the thin film transistor layer 20 of the first thick film portion Wc1 and the second thick film portion Wc2 is formed by the base coat film 11, the semiconductor layers 12n1, 12n2, the gate insulating film 13, the first metal portions 14n1, 14n2, the first interlayer insulating film 15, the second metal portions 16n1, 16n2, the second interlayer insulating film 17, and the third metal portions 18n1, 18n2. On the other hand, the inorganic film included in the thin film transistor layer 20 of the region between the first thick film portion Wc1 and the through-hole H is formed by the base coat film 11 and the semiconductor layer 12n1. As a result, the number of layers of the inorganic film included in the thin film transistor layer 20 is greater in the first thick film portion Wc1 and the second thick film portion Wc2 and the film thickness of the inorganic film included in the thin film transistor layer 20 is thicker than those in the region between the first thick film portion Wc1 and the through-hole H.

Further, the inorganic film included in the thin film transistor layer 20 of the region between the second thick film portion Wc2 and the first frame-shaped protruding portion Wa is formed by the base coat film 11, the gate insulating film 13, the first interlayer insulating film 15, and the second interlayer insulating film 17. As a result, a number of layers of the inorganic film included in the thin film transistor layer 20 is greater in the first thick film portion Wc1 and the second thick film portion Wc2 and a total film thickness of the inorganic film included in the thin film transistor layer 20 is thicker than those in the region between the second thick film portion Wc2 and the first frame-shaped protruding portion Wa.

As a result, when the through-hole H is formed, cracks can be prevented from occurring in the inorganic film included in the thin film transistor layer 20 in the region surrounding the first thick film portion Wc1 and the second thick film portion Wc2.

Further, the first protruding portion Wb1 and the second protruding portion Wb2 are formed of the same material and in the same layer as those of the flattening film 19 (on the second interlayer insulating film 17), in a frame-like shape in the non-display region N. The first protruding portion Wb1 is formed overlapping the first thick film portion Wc1. The second protruding portion Wb2 is formed overlapping the second thick film portion Wc2. The first protruding portion Wb1 and the second protruding portion Wb2 each include side surfaces in a transverse section that form a tapered shape (shape in which both side surfaces gradually narrow from the bottom face toward the top face). The first protruding portion Wb1 and the second protruding portion Wb2 are formed between the first inorganic film 26 of the sealing film 29 and the second interlayer insulating film 17 of the thin film transistor layer 20 in the non-display region N, thereby separating the two and making it possible to prevent the occurrence of cracks therein. Further, the first protruding portion Wb1 and the second protruding portion Wb2 also function as dampers (cushioning members) between the first inorganic film 26 of the sealing film 29 and the second interlayer insulating film 17 of the thin film transistor layer 20, which also makes it possible to prevent the occurrence of cracks in the first inorganic film 26 and the second interlayer insulating film 17.

Light-Emitting Element Formation Process

As illustrated in FIG. 4, FIG. 5, FIG. 7(a), and FIG. 7(b), the organic EL element 25 is formed on the thin film transistor layer 20 formed in the thin film transistor layer formation process described above by forming the first electrode 21, the edge cover 22, the organic EL layer 23 (the hole injection layer 1, the hole transport layer 2, the light-emitting layer 3, the electron transport layer 4, and the electron injection layer 5) and the second electrode 24 by using a known method.

The first frame-shaped protruding portion Wa is formed by, for example, patterning (exposing, developing, and baking), all at once or in two stages, the photosensitive resin film used in forming the flattening film 19 in the thin film transistor layer formation process described above and the photosensitive resin film used in forming the edge cover 22 in this light-emitting element formation process (first frame-shaped protruding portion formation process). In the first frame-shaped protruding portion formation process, the first frame-shaped protruding portion Wa has an inversely tapered shape and is formed surrounding the periphery of the through-hole H in the non-display region N.

Note that the first protruding portion Wb1 and the second protruding portion Wb2 may each be formed of the same material and in the same layer as those of the edge cover 22 instead of those of the flattening film 19, in a frame-like shape.

As illustrated in FIG. 5 and FIG. 7(a), after the first frame-shaped protruding portion formation process, the common function layer formation process is performed followed by the second electrode formation process. In the common function layer formation process, the common function layers 100 (for example, the hole injection layer 1, the electron transport layer 4, and the electron injection layer 5) are formed using a CCM on the substrate front face on which the first frame-shaped protruding portion Wa is formed. As a result, the common function layers 100 are also formed on the first frame-shaped protruding portion Wa, the first protruding portion Wb1, and the second protruding portion Wb2.

Further, in the second electrode formation process, the second electrode 24 is formed using a CMM on the substrate front face on which the first frame-shaped protruding portion Wa is formed. As a result, the second electrode 24 is also formed on the first frame-shaped protruding portion Wa, the first protruding portion Wb1, and the second protruding portion Wb2.

Here, the first frame-shaped protruding portion Wa formed in the first frame-shaped protruding portion formation process has a shape protruding in the thickness direction of the resin substrate layer 10 and thus, of the common function layers 100 and the second electrode 24, both side surfaces and the base portion vicinity of the first frame-shaped protruding portion Wa are formed disconnected by a step, that is, with a gap. In particular, because the first frame-shaped protruding portion Wa has an inversely tapered shape, the both side surfaces and the base portion vicinity of the common function layers 100 and the second electrode 24 are formed disconnected by a step, that is, with a gap.

Then, as illustrated in FIG. 5 and FIG. 7(b), the slit formation process is performed after the second electrode formation process and before the sealing film formation process.

In the slit formation process, laser light is irradiated in a frame-like shape so as to surround the outer periphery of the first frame-shaped protruding portion Wa, in a region of the second electrode 24 formed in the second electrode formation process, between the first frame-shaped protruding portion Wa and the flattening film 19. As a result, the slit SL is formed in a frame-like shape so as to surround the outer periphery of the first frame-shaped protruding portion Wa, in a region of the second electrode 24, between the first frame-shaped protruding portion Wa and the flattening film 19.

Sealing Film Formation Process

First, as illustrated in FIG. 5 and FIG. 7(c), in the light-emitting element formation process described above, the first inorganic film 26 is formed by forming an inorganic insulating film, such as a silicon nitride film, for example, through plasma CVD at a thickness of about 900 nm on an entire surface of a front face of the second electrode 24 (first inorganic film formation process). As a result, the slit SL in the second electrode 24 formed in the slit formation process is covered by the first inorganic film 26. As a result, the first inorganic film 26 is also layered on the first frame-shaped protruding portion Wa, the first protruding portion Wb1, and the second protruding portion Wb2.

Here, the first frame-shaped protruding portion Wa has an inversely tapered shape and thus, of the first inorganic film 26, both side surfaces and the base portion vicinity of the first frame-shaped protruding portion Wa are formed disconnected by a step, that is, with a gap.

Next, an organic film composed of an organic material such as acrylate is formed, on the entire front face of the substrate on which the first inorganic film 26 is formed, to have a thickness of about 200 nm by using, for example, a vacuum vapor deposition technique (organic film formation process). Thereafter, the formed organic film is ashed by a plasma. As a result, the organic buffer layer 27a is formed (ashing process). Here, while a major portion of the organic film formed by the organic film formation process is removed by ashing in the ashing process, the organic buffer layer 27a is formed, filling the step-disconnected portion of the common function layer 100, the second electrode 24, and the first inorganic film 26 formed on both side surfaces and the base portion vicinity of the first frame-shaped protruding portion Wa. As a result, at the step-disconnected portion of the first inorganic film 26, the second electrode 24, and the common function layer 100 at both side surfaces and the base portion vicinity of the first frame-shaped protruding portion Wa, the organic buffer layer 27a comes into contact with both side surfaces of the first frame-shaped protruding portion Wa and in contact with the second interlayer insulating film 17. Further, the organic buffer layer 27a is residually formed so as to cover foreign matters on the first inorganic film 26, even in areas other than both side surfaces and the base portion vicinity of the first frame-shaped protruding portion Wa.

Next, as illustrated in FIG. 5 and FIG. 7(d), an inorganic insulating film such as a silicon nitride film, for example, is formed on the entire surface of the substrate front face on which the organic buffer layer 27a is formed to a thickness of about 500 nm by using plasma CVD, thereby forming the second inorganic film 28 overlapping the first inorganic film 26 (second inorganic film formation process). As a result, the second inorganic film 28 is also layered on the first frame-shaped protruding portion Wa, the first protruding portion Wb1, and the second protruding portion Wb2. Then, the sealing film 29 including the first inorganic film 26, the organic buffer layer 27a, and the second inorganic film 28 is formed.

At the step-disconnected portion of the first inorganic film 26, the second electrode 24, and the common function layer 100 of both side surfaces and the base portion vicinity of the first frame-shaped protruding portion Wa, the organic buffer layer 27a is filled and thus, even at the step-disconnected portion, the second inorganic film 28 is formed without being disconnected by a step.

Flexing Process

The glass substrate 9a is peeled from the resin substrate layer 10 by irradiating the substrate on which the sealing film 29 was formed in the sealing film formation process while scanning the laser light from the glass substrate 9a side. Then, the film 9 is bonded to a surface of the resin substrate layer 10 from which the glass substrate 9a was peeled.

Through-Hole Formation Process

The inside of the first frame-shaped protruding portion Wa of the substrate to which the film 9 was bonded in the flexing process described above is irradiated with laser light while scanning in a ring shape, for example. As a result, the through-hole H having an island shape is formed in the display region D. Thus, the display device 50a of the present embodiment can be manufactured as described above.

As described above, according to the display device 50a and the method for manufacturing the same according to the present embodiment, in the first frame-shaped protruding portion formation process, the first frame-shaped protruding portion Wa is formed in the non-display region N having an island shape in the display region D. Then, in the common function layer formation process, the common function layer 100 is formed on the substrate front face. Further, in the second electrode formation process, the second electrode 24 is formed on the substrate front face.

Then, the first frame-shaped protruding portion Wa is formed in a frame-like shape so as to protrude in the thickness direction of the resin substrate layer 10 and extend along the boundary with the display region D. Thus, in the non-display region N, the common function layer 100 and the second electrode 24 are formed disconnected by a step, that is, with a gap, on both side surfaces of the first frame-shaped protruding portion Wa. As a result, in the common function layer 100 and the second electrode 24, separation can be made at an inner peripheral side and an outer peripheral side of the first frame-shaped protruding portion Wa. Thus, even if moisture penetrates the second electrode 24 from the end portions of common function layer 100 and the second electrode 24 exposed through the through-hole H, for example, the moisture can be prevented from being transmitted through the second electrode 24 and penetrating from the inner peripheral side to the outer peripheral side of the first frame-shaped protruding portion Wa, that is, the second electrode 24 in the display region D.

Here, when the common function layer 100 and the second electrode 24 are disconnected by a step on both side surfaces of the first frame-shaped protruding portion Wa, the first inorganic film 26 layered on the second electrode 24 tends to be similarly disconnected by a step on both side surfaces of the first frame-shaped protruding portion Wa. When the first inorganic film 26 is disconnected by a step, the sealing performance of the sealing film 29 deteriorates.

Thus, in the display device 50a, the organic buffer layer 27a is formed so as to fill the locations where the common function layer 100, the second electrode 24, and the first inorganic film 26 are disconnected by a step on both side surfaces of the first frame-shaped protruding portion Wa, in the organic film formation process and the ashing process. That is, the locations where the common function layer 100, the second electrode 24, and the first inorganic film 26 are disconnected by a step are filled with the organic buffer layer 27a. As a result, at the locations where the common function layer 100, the second electrode 24, and the first inorganic film 26 are disconnected by a step, the organic buffer layer 27a comes into contact with both side surfaces of the first frame-shaped protruding portion Wa and into contact with the second interlayer insulating film 17.

Then, in the second inorganic film formation process, the second inorganic film 28 is formed. As a result, the first frame-shaped protruding portion Wa is formed and thus, even in locations where the common function layer 100, the second electrode 24, and the first inorganic film 26 are disconnected by a step, the locations are filled with the organic buffer layer 27a, making it possible to prevent the second inorganic film 28 from becoming disconnected by a step. As a result, it is possible to prevent moisture from penetrating the display region D through the second electrode 24 and to seal, and not disconnect by a step, the inner side and outer side of the first frame-shaped protruding portion Wa by the sealing film 29.

That is, the sealing performance of the sealing film 29 can be ensured in the display device 50a even if the non-display region N having an island shape is provided inside the display region D.

Furthermore, because the common function layer 100 and the second electrode 24 are disconnected by a step by the first frame-shaped protruding portion Wa, the common function layer 100 can be patterned in an apertured shape without using a mask having a floating island structure, and the penetration of moisture into the organic EL element 25 via the common function layer 100 and the second electrode 24 can be suppressed.

Furthermore, in the display device 50a, the slit formation process is provided after the second electrode formation process and before formation of the sealing film 29, and the slit SL having a frame-like shape is formed in the slit formation process in a region of the common function layer 100, between the first frame-shaped protruding portion Wa and the flatten film 19, so as to surround the outer periphery of the first frame-shaped protruding portion Wa. As a result, the common function layer 100 is reliably separated on an inner side and an outer side of the slit SL. Thus, even if the first frame-shaped protruding portion Wa is formed and the second electrode 24 is not disconnected by a step on the inner side and the outer side of the first frame-shaped protruding portion Wa, for example, the second electrode 24 can be separated by the slit SL on the inner side and the outer side of the slit SL. Further, the slit SL is formed in the common function layer 100 similarly to the second electrode 24. This makes it possible to more reliably prevent moisture from penetrating the display region D through the common function layer 100 and the second electrode 24. That is, the slit SL is formed in both the common function layer 100 and the second electrode 24.

Further, according to the display device 50a and the method for manufacturing the same of the present embodiment, both side surfaces of the first frame-shaped protruding portion Wa have an inversely tapered shape with an angle θ formed with the bottom face being from 70° to 150°, and thus the common function layer 100 and the second electrode 24 are more readily disconnected by a step.

In addition, according to the display device 50a and the method for manufacturing the same according to the embodiment, the thick film portion Wc is provided between the first frame-shaped protruding portion Wa and the through-hole H. In the present embodiment, the thick film portion Wc includes the first thick film portion Wc1 and the second thick film portion Wc2. The first thick film portion Wc1 and the second thick film portion Wc2 are composed of a plurality of inorganic films included in the thin film transistor layer 20.

Then, the total film thickness of the plurality of inorganic films included in the first thick film portion Wc1 is greater than the total film thickness of the plurality of inorganic films included in the thin film transistor layer 20 provided in the region between the first thick film portion Wc1 and the through-hole H.

In the present embodiment, the first thick film portion Wc1 and the second thick film portion Wc2 are provided by layering the base coat film 11, the semiconductor layers 12n1, 12n2, the gate insulating film 13, the first metal portions 14n1, 14n2, the first interlayer insulating film 15, the second metal portions 16n1, 16n2, the second interlayer insulating film 17, and the third metal portions 18n1, 18n2, formed of the same material as that of the inorganic film constituting the thin film transistor layer 20.

Then, a film thickness of the first thick film portion Wc1 is defined as a film thickness TH1. The film thickness TH1 is the total film thickness of the base coat film 11, the semiconductor layer 12n1, the gate insulating film 13, the first metal portion 14n1, the first interlayer insulating film 15, the second metal portion 16n1, the second interlayer insulating film 17, and the third metal portion 18n1.

A film thickness of a first region, which is a portion of the region between the first thick film portion Wc1 and the through-hole H, adjacent to the first thick film portion Wc1, is defined as a film thickness TH2. The film thickness TH2 is the total film thickness of the base coat film 11, the semiconductor layer 12n1, the gate insulating film 13, the first interlayer insulating film 15, and the second interlayer insulating film 17. That is, the film thickness TH2 is a value obtained by subtracting the total film thickness of the first metal portion 14n1, the second metal portion 16n1, and the third metal portion 18n1 from the film thickness TH1. Accordingly, the film thickness TH1 is greater than the film thickness TH2.

Further, a film thickness of a second region, which is a portion of the region between the first thick film portion Wc1 and the through-hole H, adjacent to the first region and closer to the through-hole H than the first region, is defined as a film thickness TH3. The film thickness TH3 is the total film thickness of the base coat film 11 and the semiconductor layer 12n1. That is, the film thickness TH3 is a value obtained by subtracting the total film thickness of the gate insulating film 13, the first metal portion 14n1, the first interlayer insulating film 15, the second metal portion 16n1, the second interlayer insulating film 17, and the third metal portion 18n1 from the film thickness TH1. Accordingly, the film thickness TH1 is greater than the film thickness TH3.

In this way, the total film thickness of the inorganic films of the first thick film portion Wc1 is greater than the total film thickness of the inorganic films on the through-hole H side of the first thick film portion Wc1.

As a result, it is possible to prevent cracks from occurring in the inorganic film included in the thin film transistor layer 20 on the outer peripheral side closer to the display region D than the first thick film portion Wc1, particularly on the outer peripheral side of the second thick film portion Wc2.

Further, according to the display device 50a and the method for manufacturing the same according to the embodiment, the first protruding portion Wb1 is formed in a frame-like shape, overlapping the first thick film portion Wc1. As a result, the first protruding portion Wb1 functions as a cushioning member between the sealing film 29 and the second interlayer insulating film 17, separating the two. Further, the second protruding portion Wb2 is formed in a frame-like shape, overlapping the second thick film portion Wc2. As a result, the second protruding portion Wb2 functions as a cushioning member between the sealing film 29 and the second interlayer insulating film 17, separating the two. As a result, cracks can be prevented from occurring in the inorganic films included in the thin film transistor layer 20 on the display region D side of the second thick film portion Wc2.

Modified Example of First Frame-Shaped Protruding Portion Wa

A first modified example to a fifth modified example of the first frame-shaped protruding portion Wa will be described using FIG. 8 to FIG. 12. The first frame-shaped protruding portion Wa described using FIG. 5 has a dual-layer structure formed of the same material and in the same layer as those of each of the flattening film 19 and the edge cover 22. However, the first frame-shaped protruding portion Wa may adopt various structures as long as the common function layer 100 and the second electrode 24 are disconnected by a step. Note that, as with the first frame-shaped protruding portion Wa described using FIG. 1 and the like, the position of formation of the first frame-shaped protruding portion Wa according to the first modified example to the fifth modified example described in FIG. 8 to FIG. 12 is formed in a frame-like shape between the second frame-shaped protruding portion Wb and the slit SL in the second electrode 24, in the non-display region N.

Figure 8:
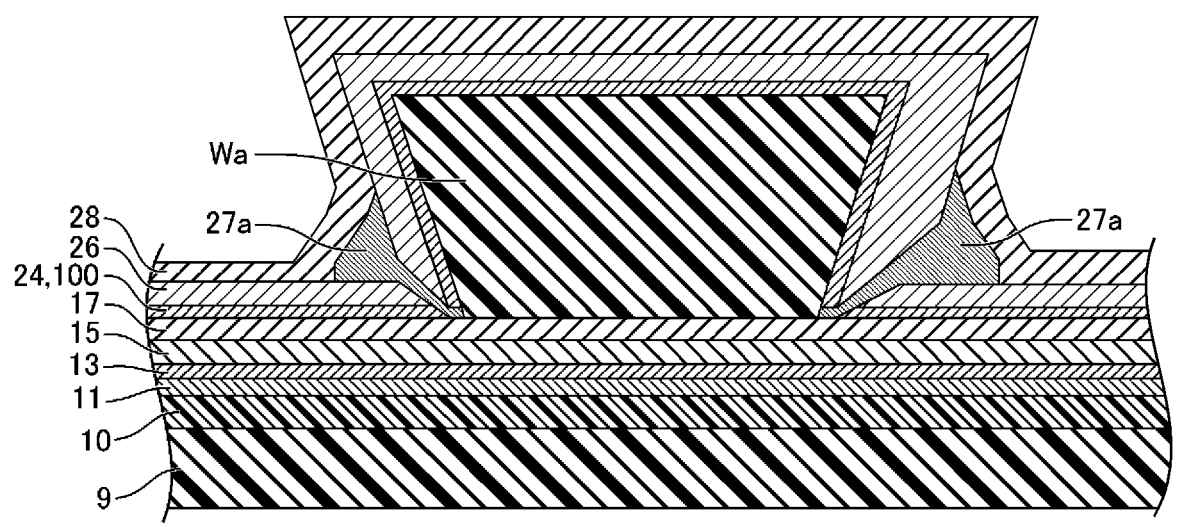
FIG. 8 is a cross-sectional view illustrating a configuration of a first modified example of a first frame-shaped protruding portion of the embodiment.

FIG. 8 is a cross-sectional view illustrating a configuration of the first modified example of the first frame-shaped protruding portion Wa of the embodiment. As illustrated in FIG. 8, the first frame-shaped protruding portion Wa may have a single-layer structure formed of the same material and in the same layer as those of the flattening film 19.

Figure 9:
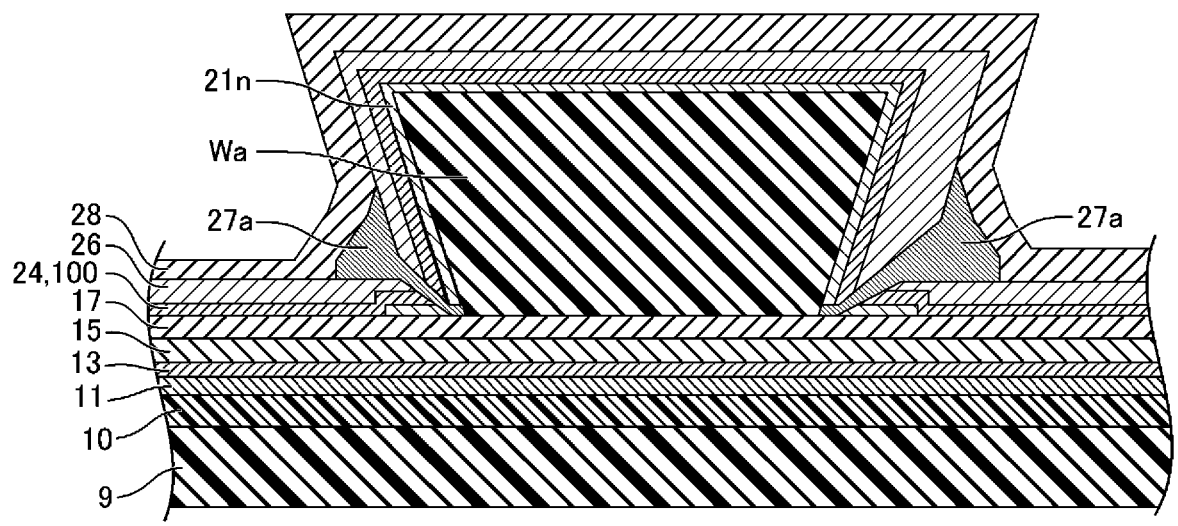
FIG. 9 is a cross-sectional view illustrating a configuration of a second modified example of the first frame-shaped protruding portion of the embodiment.

FIG. 9 is a cross-sectional view illustrating a configuration of the second modified example of the first frame-shaped protruding portion Wa of the embodiment. As illustrated in FIG. 9, the first frame-shaped protruding portion Wa may be formed of the same material and in the same layer as those of the flattening film 19, and may be further covered by a metal film 21n formed of the same material and in the same layer as those of the first electrode 21. The metal film 21n is formed between the first frame-shaped protruding portion Wa and the second electrode 24. The metal has ductility and thus, by providing the metal film 21n, it is possible to prevent cracks from occurring in the flattening film 19.

Figure 10:
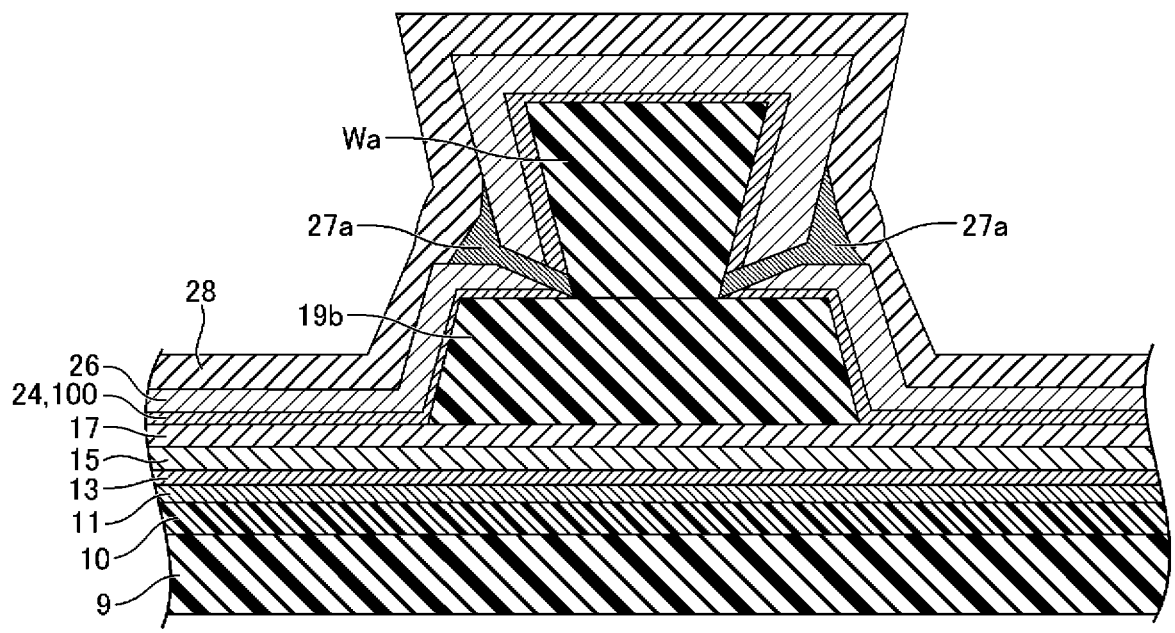
FIG. 10 is a cross-sectional view illustrating a configuration of a third modified example of the first frame-shaped protruding portion of the embodiment.

FIG. 10 is a cross-sectional view illustrating a configuration of the third modified example of the first frame-shaped protruding portion Wa of the embodiment. As illustrated in FIG. 10, prior to formation of the first frame-shaped protruding portion Wa, a protruding portion 19b formed of the same material and in the same layer as those of the flattening film 19 may be formed and then, on the protruding portion 19b, the first frame-shaped protruding portion Wa may be formed of the same material and in the same layer as those of the edge cover 22. The protruding portion 19b and the first frame-shaped protruding portion Wa are each formed in a frame-like shape. Further, the protruding portion 19b is formed with a width wider than that of the first frame-shaped protruding portion Wa. The first frame-shaped protruding portion Wa is formed with an inversely tapered shape, but the protruding portion 19b may be formed with a tapered shape.

As a result, the protruding portion 19b having a width wider than that of the first frame-shaped protruding portion Wa is formed in a lower layer of the first frame-shaped protruding portion Wa, thereby increasing a path length from the through-hole H of the first inorganic film 26 and the second inorganic film 28 to the display region D. Therefore, when the through-hole H is formed, even if cracks occur in the first inorganic film 26 and the second inorganic film 28, it is possible to keep the cracks from reaching the display region D.

Figure 11:
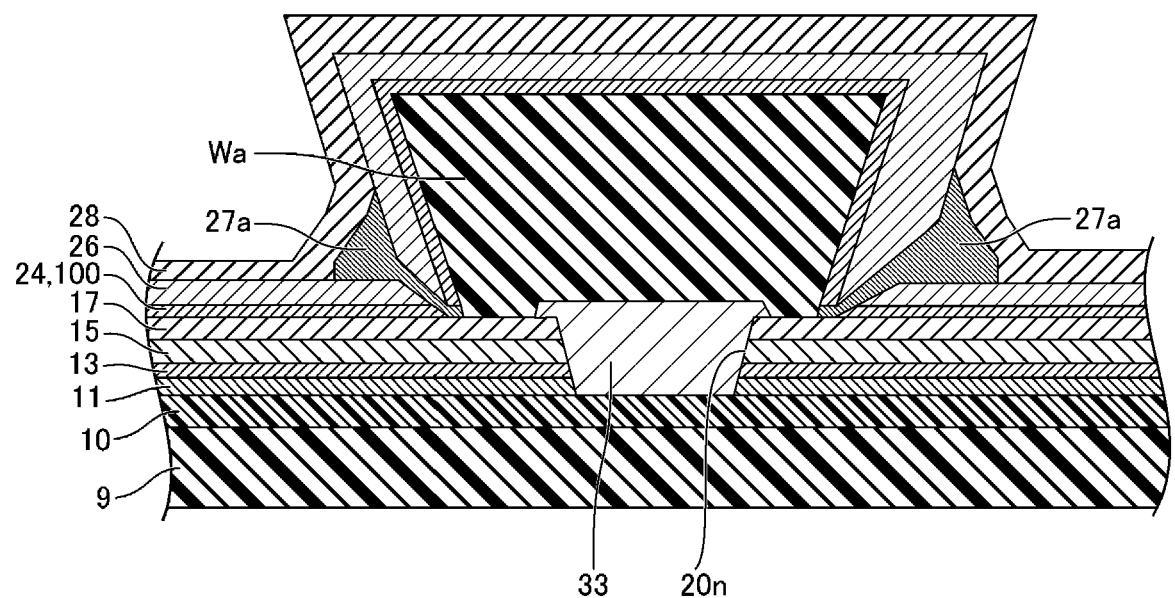
FIG. 11 is a cross-sectional view illustrating a configuration of a fourth modified example of the first frame-shaped protruding portion of the embodiment.

FIG. 11 is a cross-sectional view illustrating a configuration of the fourth modified example of the first frame-shaped protruding portion Wa of the embodiment. After the thin film transistor layer (refer to FIG. 4) 20 is formed and before the first frame-shaped protruding portion Wa is formed, a groove 20n having a frame shape is formed in the region where the first frame-shaped protruding portion Wa is formed, and the groove 20n is filled with a filling layer 33 composed of a resin material. Then, the first frame-shaped protruding portion Wa is formed on the filling layer 33 and the flattening film 19, covering the filling layer 33. The filling layer 33 is formed of the same material and in the same layer as those of the filling layer used in the bending portion B. That is, the groove 20n and the filling layer 33 may be formed simultaneously during formation of the bending portion B. The first frame-shaped protruding portion Wa may be formed of the same material and in the same layer as those of the flattening film 19, or may be formed of the same material and in the same layer as those of the edge cover 22.

In this way, the groove 20*n* is provided in the thin film transistor layer 20 in a lower layer of the first frame-shaped protruding portion Wa, and the groove 20*n* is filled with the filling layer 33, thereby making it possible to prevent cracks from occurring in the inorganic films of the thin film transistor layer 20 when a through-hole H is formed.

Figure 12:
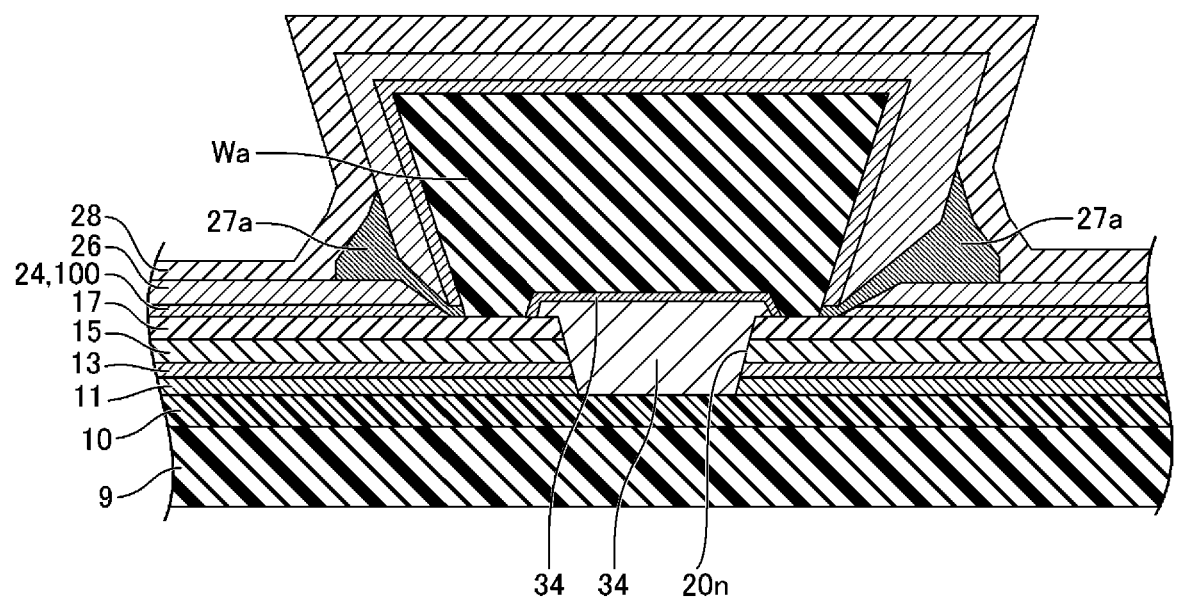
FIG. 12 is a cross-sectional view illustrating a configuration of a fifth modified example of the first frame-shaped protruding portion of the embodiment.

FIG. 12 is a cross-sectional view illustrating a configuration of the fifth modified example of the first frame-shaped protruding portion Wa of the embodiment. As illustrated in FIG. 12, the filling layer 33 illustrated in FIG. 11 may be covered by a metal film 34, and then the first frame-shaped protruding portion Wa may be formed. The metal film 34 is formed of the same material and in the same layer as those of the power source line 18*g*. In this way, the filling layer 33 is further covered by the metal film 34, thereby preventing cracking from occurring in the filling layer 33.

Figure 13:
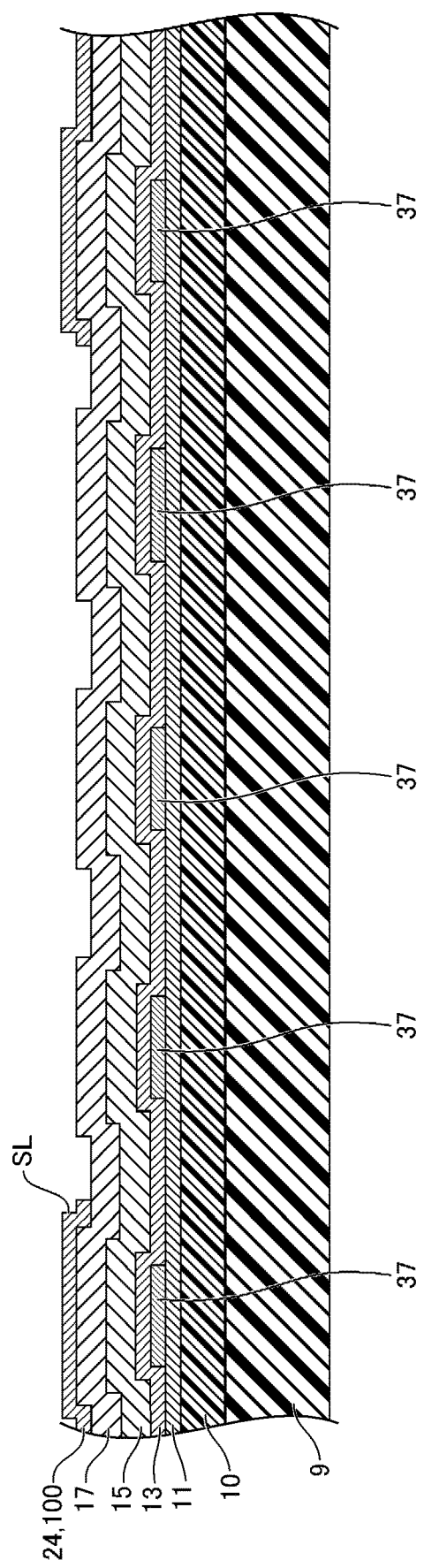
FIG. 13 is a cross-sectional view illustrating a configuration of a modified example of a slit portion of the embodiment.
Figure 14:
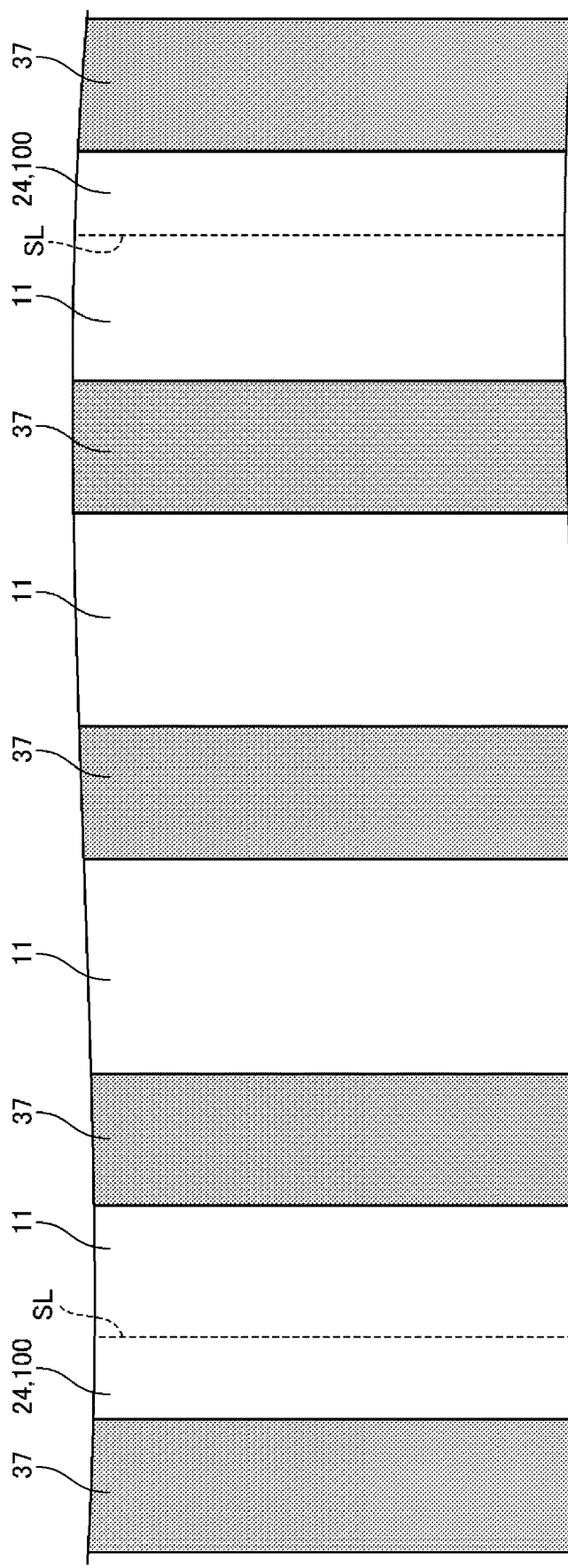
FIG. 14 is a plan view illustrating the configuration of the modified example of the slit portion of the embodiment.

FIG. 13 is a cross-sectional view illustrating a configuration of a modified example of the slit SL portion of the embodiment. FIG. 14 is a plan view illustrating the configuration of the modified example of the slit SL portion of the embodiment. As illustrated in FIG. 13 and FIG. 14, a plurality of frame-shaped pattern portions 37 formed in a frame-like shape may be formed in a lower layer of the formation region of the slit SL.

As a result, the common function layer 100 and the second electrode 24 before formation of the slit SL are raised by the plurality of frame-shaped pattern portions 37. Thus, when the slit SL is formed, even if the focus of the light source irradiating the laser light is shifted, the slit SL can be more reliably formed in the common function layer 100 and the second electrode 24. Further, because the slit SL can be reliably formed, it is possible to achieve a reliable seal by the sealing film 29 in the region where the slit SL is formed.

The frame-shaped pattern portion 37 may be formed of the same material and in the same layer as those of the semiconductor layers 12*a*, 12*b*, or may be formed of the same material and in the same layer as those of the gate electrodes 14*a*, 14*b*, or may be formed of the same material and in the same layer as those of the upper conductive layer 16, or may be formed of the same material and in the same layer as those of the power source line 18 *g*, or may be formed of the same material and in the same layer as those of the first electrode 21. However, when the frame-shaped pattern portion 37 is formed of a metal material, the frame-shaped pattern portion 37 may melt due to the heat of the laser light during formation of the slit SL and thus is preferably formed of the same material as that of the semiconductor layers 12*a*, 12*b*. As a result, it is possible to prevent the frame-shaped pattern portion 37 from melting due to the heat of the laser light during formation of the slit SL.

Other Embodiments

In the embodiments described above, the example of the organic EL layer including the five-layer structure including the hole injection layer, the hole transport layer, the light-emitting layer, the electron transport layer, and the electron injection layer is given. It is also possible that, for example, the organic EL layer may include a three-layer structure including a hole injection-cum-transport layer, a light-emitting layer, and an electron transport-cum-injection layer.

Further, in each of the embodiments described above, the display device including the first electrode as an anode electrode and the second electrode as a cathode electrode is exemplified. However, the disclosure is also applicable to a display device in which the layered structure of the organic EL layer is reversed with the first electrode being a cathode electrode and the second electrode being an anode electrode.

In addition, in each of the embodiments described above, the display device including an element substrate in which the electrode of the thin film transistor connected to the first electrode serves as the drain electrode is exemplified. However, the disclosure is also applicable to a display device including an element substrate in which the electrode of the thin film transistor connected to the first electrode is referred to as the source electrode.

Further, in each of the embodiments described above, the display device is exemplified and described as a display device. However, the disclosure is also applicable to a display device including a plurality of light-emitting elements driven by an electrical current. For example, the disclosure is applicable to a display device including quantum-dot light emitting diodes (QLEDs) that are light-emitting elements using a quantum dot-containing layer.

The invention claimed is:

1. A display device comprising:
   a base substrate;
   a thin film transistor layer provided on the base substrate and including an upper layer insulating film and an organic resin layer;
   a plurality of light-emitting elements provided on the thin film transistor layer, each of the plurality of light-emitting elements including a common function layer formed continuously across each subpixel constituting a display region;
   a sealing film covering the plurality of light-emitting elements and including a first inorganic insulating film and a second inorganic insulating film layered in that order;
   a non-display region provided in an island shape in the display region;
   an opening provided in the non-display region and passing through the base substrate;
   a first frame-shaped protruding portion located in the non-display region between the opening and the display region and provided on the upper layer insulating film in a circumferential shape along the opening;
   an organic buffer layer provided on a side surface of the first frame-shaped protruding portion and interposed between the first inorganic insulating film and the second inorganic insulating film; and
   a plurality of frame-shaped pattern portions,
   wherein the first frame-shaped protruding portion includes a portion where a distance of both side surfaces gradually narrows from an upper face to a bottom face,
   the common function layer is also provided in the non-display region,
   a slit surrounding the first frame-shaped protruding portion is formed in the common function layer provided in the non-display region, and
   the plurality of frame-shaped pattern portions surrounds the first frame-shaped protruding portion in a frame-like shape in a lower layer of a region where the slit of the common function layer is formed.

2. The display device according to claim 1,
   wherein the common function layer, the first inorganic insulating film, and the second inorganic insulating film layered in that order are provided on the upper face of the first frame-shaped protruding portion, and the common function layer, the first inorganic insulating film, the organic buffer layer, and the second inorganic insulating film layered in that order are provided on the side surface of the first frame-shaped protruding portion.

3. The display device according to claim 2, wherein a metal film is formed between the first frame-shaped protruding portion and the common function layer.

4. The display device according to claim 1, further comprising:
a first electrode provided on the organic resin layer on a per subpixel basis; and
an edge cover provided on the organic resin layer over an end portion of the first electrode, and formed of a resin material,
wherein the first frame-shaped protruding portion is formed of the resin material forming the edge cover.

5. The display device according to claim 4, wherein the first frame-shaped protruding portion is provided on the organic resin layer.

6. The display device according to claim 1, wherein the first frame-shaped protruding portion is formed of a material forming the organic resin layer.

7. The display device according to claim 1, further comprising:
a filling layer serving as a lower layer of the first frame-shaped protruding portion,
wherein the first frame-shaped protruding portion is provided on the upper layer insulating film,
a groove is formed in a region of the upper layer insulating film provided with the first frame-shaped protruding portion, and
the groove is filled with the filling layer.

8. The display device according to claim 7, further comprising:
a metal film provided between the filling layer and the first frame-shaped protruding portion and thus covering the filling layer.

9. The display device according to claim 1, further comprising:
a plurality of third inorganic films included in the thin film transistor layer; and
a thick film portion between the first frame-shaped protruding portion and the opening, and composed of a plurality of fourth inorganic films surrounding the opening,
wherein a total film thickness of the plurality of fourth inorganic films included in the thick film portion is greater than a total film thickness of the plurality of third inorganic films included in the thin film transistor layer provided between the thick film portion and the opening.

10. The display device according to claim 9, wherein the thin film transistor layer further includes a lower layer insulating film provided in a lower layer of the upper layer insulating film, and
the plurality of fourth inorganic films included in the thick film portion includes one of the upper layer insulating film and the lower layer insulating film.

11. The display device according to claim 10, wherein the thin film transistor layer further includes a metal film, and
the plurality of fourth inorganic films included in the thick film portion further includes a metal film formed of a same material as the metal film of the thin film transistor layer.

12. The display device according to claim 9, further comprising:
a second protruding portion provided in a frame-like shape on an upper layer of the thick film portion and composed of a resin material.

13. The display device according to claim 12, wherein the second protruding portion overlaps the thick film portion.

14. The display device according to claim 1, wherein the thin film transistor layer further includes a semiconductor layer, and
the plurality of frame-shaped pattern portions is formed of a same material as the semiconductor layer.

15. A display device comprising:
a base substrate;
a thin film transistor layer provided on the base substrate and including an upper layer insulating film and an organic resin layer;
a plurality of light-emitting elements provided on the thin film transistor layer, each of the plurality of light-emitting elements including a common function layer formed continuously across each subpixel constituting a display region;
a sealing film covering the plurality of light-emitting elements and including a first inorganic insulating film and a second inorganic insulating film layered in that order;
a non-display region provided in an island shape in the display region;
an opening provided in the non-display region and passing through the base substrate;
a first frame-shaped protruding portion located in the non-display region between the opening and the display region and provided on the upper layer insulating film in a circumferential shape along the opening;
an organic buffer layer provided on a side surface of the first frame-shaped protruding portion and interposed between the first inorganic insulating film and the second inorganic insulating film;
a plurality of third inorganic films included in the thin film transistor layer; and
a thick film portion between the first frame-shaped protruding portion and the opening, and composed of a plurality of fourth inorganic films surrounding the opening,
wherein the first frame-shaped protruding portion includes a portion where a distance of both side surfaces gradually narrows from an upper face to a bottom face,
the common function layer is also provided in the non-display region, and
a slit surrounding the first frame-shaped protruding portion is formed in the common function layer provided in the non-display region,
a total film thickness of the plurality of fourth inorganic films included in the thick film portion is greater than a total film thickness of the plurality of third inorganic films included in the thin film transistor layer provided between the thick film portion and the opening,
the thin film transistor layer further includes a lower layer insulating film provided in a lower layer of the upper layer insulating film, the plurality of fourth inorganic films included in the thick film portion includes one of the upper layer insulating film and the lower layer insulating film, the thin film transistor layer further includes a semiconductor layer, and the plurality of fourth inorganic films included in the thick film portion further includes a semiconductor layer formed of a same material as the semiconductor layer of the thin film transistor layer.

16. The display device according to claim 15, further comprising:

a second protruding portion provided in a frame-like shape on an upper layer of the thick film portion and composed of a resin material.

17. The display device according to claim 16, wherein the second protruding portion overlaps the thick film portion.

* * * * *